United States Patent
Nguyen et al.

(10) Patent No.: US 12,431,202 B2
(45) Date of Patent: Sep. 30, 2025

(54) MEMORY READ CALIBRATION BASED ON MEMORY DEVICE-ORIGINATED METRICS CHARACTERIZING VOLTAGE DISTRIBUTIONS

(71) Applicant: MICRON TECHNOLOGY, INC., Boise, ID (US)

(72) Inventors: Dung Viet Nguyen, San Jose, CA (US); Patrick R. Khayat, San Diego, CA (US); Zhengang Chen, San Jose, CA (US); Shantilal Rayshi Doru, San Diego, CA (US); Hope Abigail Henry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 18/211,802

(22) Filed: Jun. 20, 2023

(65) Prior Publication Data
US 2024/0029801 A1     Jan. 25, 2024

Related U.S. Application Data

(60) Provisional application No. 63/390,761, filed on Jul. 20, 2022.

(51) Int. Cl.
*G11C 16/34* (2006.01)
*G11C 16/26* (2006.01)

(52) U.S. Cl.
CPC .......... *G11C 16/3404* (2013.01); *G11C 16/26* (2013.01)

(58) Field of Classification Search
CPC .......................... G11C 16/3404; G11C 16/25
See application file for complete search history.

(56) References Cited

U.S. PATENT DOCUMENTS

| | | | |
|---|---|---|---|
| 8,072,805 B2* | 12/2011 | Chou | G11C 11/5642 365/185.09 |
| 8,284,612 B2* | 10/2012 | Yoshihara | G11C 16/3436 365/189.05 |
| 8,913,444 B1 | 12/2014 | Gilbert et al. | |
| 9,852,804 B2* | 12/2017 | Park | G11C 16/3431 |
| 10,991,444 B1 | 4/2021 | Bazarsky et al. | |
| 2010/0031096 A1* | 2/2010 | Di Iorio | G11C 16/349 714/704 |
| 2012/0063227 A1 | 3/2012 | Weingarten et al. | |
| 2013/0305124 A1 | 11/2013 | Scheppler et al. | |
| 2015/0378815 A1 | 12/2015 | Goda et al. | |
| 2016/0148701 A1 | 5/2016 | Karakulak et al. | |
| 2017/0162272 A1 | 6/2017 | Kavalipurapu et al. | |

(Continued)

*Primary Examiner* — Vanthu T Nguyen
(74) *Attorney, Agent, or Firm* — Lowenstein Sandler LLP

(57) ABSTRACT

Described are systems and methods for memory read calibration based on memory device-originated metrics characterizing voltage distributions. An example memory device includes: a memory array having a plurality of memory cells and a controller coupled to the memory array. The controller is to perform operations including: receiving a first metric characterizing threshold voltage distributions of a subset of the plurality of memory cells; determining a first read voltage adjustment; receiving a second metric characterizing the threshold voltage distributions; determining a second read voltage adjustment; and applying the second read voltage adjustment for reading the subset of the plurality of memory cells.

20 Claims, 19 Drawing Sheets

(56) References Cited

U.S. PATENT DOCUMENTS

| | | |
|---|---|---|
| 2018/0067666 A1 | 3/2018 | D'Abreu |
| 2020/0066354 A1 | 2/2020 | Ioannou et al. |
| 2020/0090763 A1 | 3/2020 | Tokutomi et al. |
| 2023/0005550 A1 | 1/2023 | Park |
| 2023/0176741 A1 | 6/2023 | McNeil et al. |
| 2023/0395170 A1 | 12/2023 | Rayaprolu et al. |

* cited by examiner

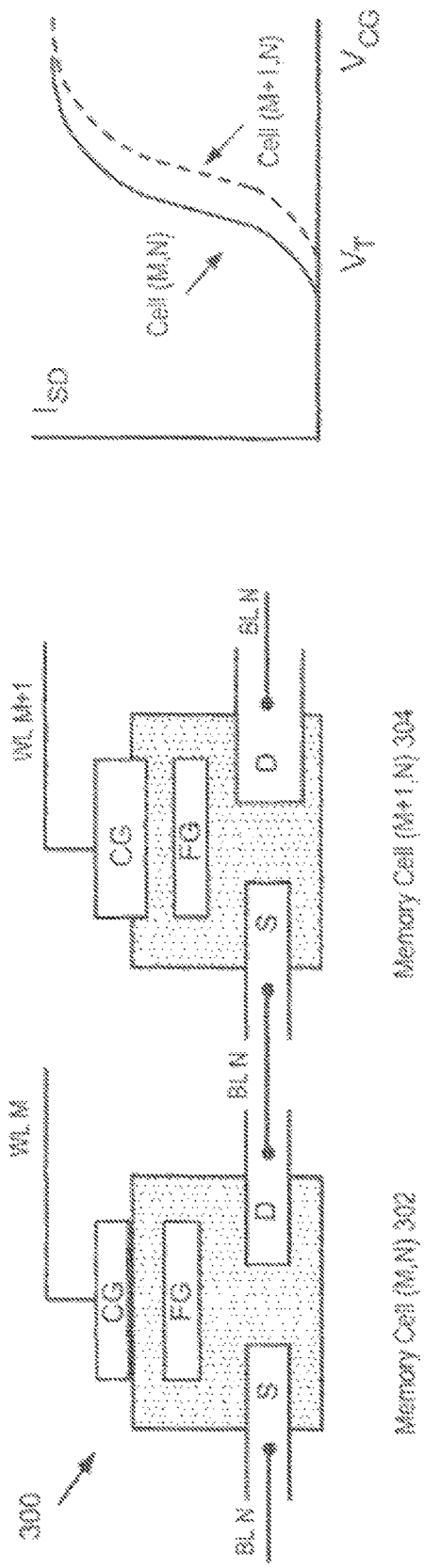
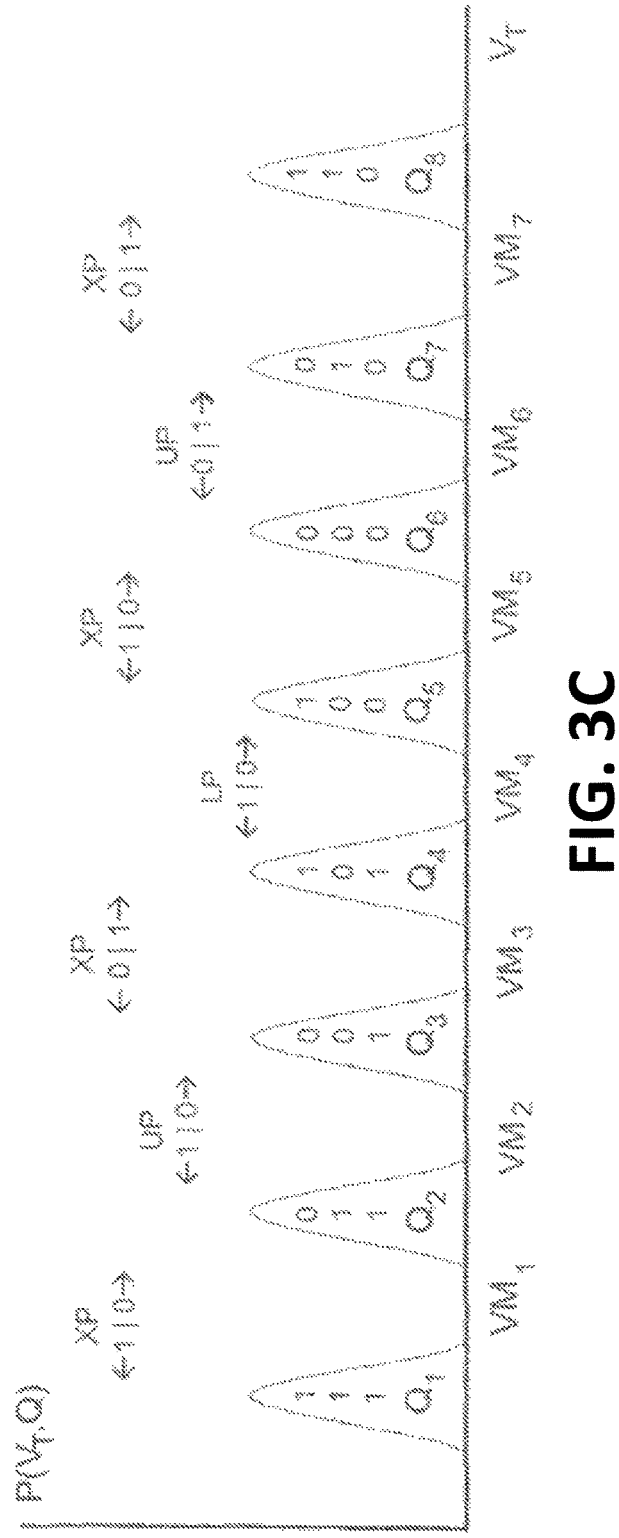
FIG. 3A
FIG. 3B
FIG. 3C

MEMORY READ CALIBRATION BASED ON MEMORY DEVICE-ORIGINATED METRICS CHARACTERIZING VOLTAGE DISTRIBUTIONS

RELATED APPLICATIONS

This application claims the benefit of U.S. Provisional Patent Application No. 63/390,761 filed Jul. 20, 2022, the entire contents of which are incorporated by reference herein.

TECHNICAL FIELD

Embodiments of the disclosure relate generally to memory sub-systems, and more specifically, to memory read calibration based on memory device-originated metrics characterizing voltage distributions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3A schematically illustrates a set of memory cells as arranged in a memory device.

FIG. 3B schematically illustrates schematically dependence of the source-drain current on the control gate voltage for two memory cells.

FIG. 3C schematically illustrates an example distribution of threshold control gate voltages for a set of memory cells.

DETAILED DESCRIPTION

Figure 1:
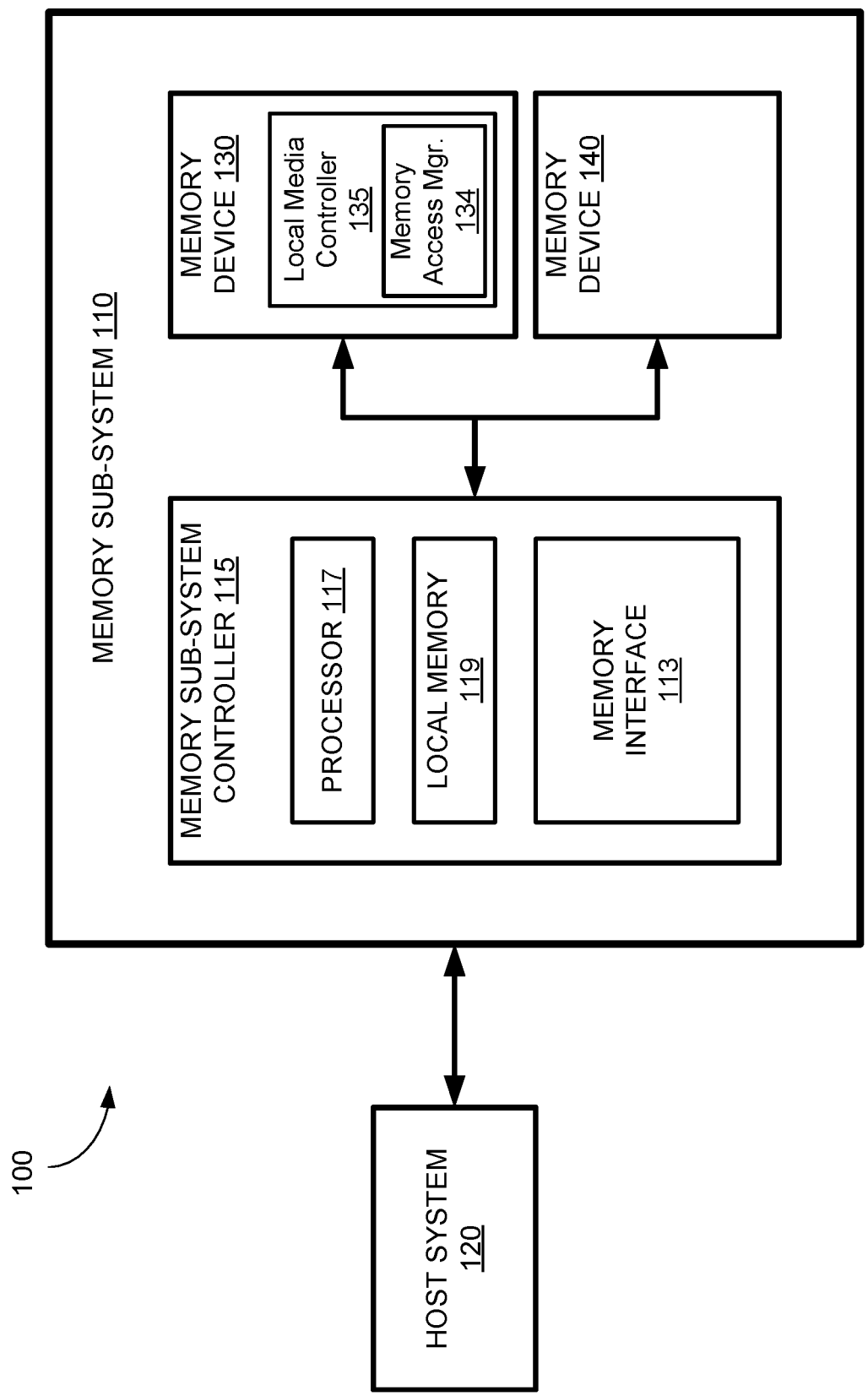
FIG. 1 illustrates an example computing system that includes a memory sub-system in accordance with some implementations of the present disclosure.

Aspects of the present disclosure are directed to memory read calibration based on memory device-originated metrics characterizing voltage distributions.

One or more memory devices can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC)

memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and quad level cells (QLC) physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

A memory device typically experiences random workloads and operating conditions, which can impact the threshold voltage distributions causing them to shift to higher or lower values. In order to compensate for various voltage distribution shifts, calibration operations can be performed in order to adjust the read levels. In some implementations, the adjustment can be performed based on values of one or more data state metrics obtained from a sequence of read and/or write operations. In an illustrative example, the data state metric can be represented by a raw bit error rate (RBER), which is the ratio of the number of erroneous bits to the number of all data bits stored in a certain portion of the memory device (e.g., in a specified data block). In some implementations, sweep reads can be performed in order to create RBER/log likelihood ratio (LLR) profiles to error correction coding (ECC) and select the most efficient profile. However, these and other calibration techniques can exhibit pure accuracy and/or high latency. Furthermore, such techniques can be effectively "blind" with respect to the voltage distribution, which means that the threshold voltage estimate produced by such calibration techniques could gradually drift into the wrong voltage distribution valley, thus making the read data uncorrectable.

Implementations of the present disclosure address the above-referenced and other deficiencies by utilizing memory device-originated metrics characterizing voltage distributions for adjusting read voltage levels. In some embodiments, the memory sub-system controller or a local media controller ("the controller") can utilize the memory device-originated metrics characterizing voltage distributions for adjusting the read level voltage in a manner that would minimize the read operation latency while providing at least a specified accuracy (e.g., a chosen error metric not exceeding a threshold value) of the read operation. The final read level voltage adjustment can be determined through an iterative process using multiple calibration operations based on the memory device-originated metrics characterizing voltage distributions. In some implementations, the controller can utilize the memory device-originated metrics characterizing voltage distributions for adjusting the read level voltage in a manner that would maximize the read operation accuracy (e.g., read voltage level accuracy) while not exceeding a specified latency of the read operation.

The methods of the present disclosure utilize metrics that are returned by the memory device in response to a read strobe. "Read strobe" herein refers to an act of applying a read level voltage to a chosen wordline thus identifying the memory cells having their respective threshold voltages below and/or above the applied read level. A read operation can include one or more read strobes. In some implementations, the controller can perform read level calibration (i.e., adjusting the read level voltages) as part of a read command flow.

In some implementations, the memory device may, upon performing a read strobe, return one or more metrics (e.g., metadata values) that reflect the conductive state of a subset of bitlines that are connected to memory cells forming at least a portion of a specified memory page. Accordingly, the metrics can be generated for the whole memory page or only for a portion of the memory page (in order to reduce latency). In some implementations, the physical boundary of the portion of memory page for which the metadata is obtained is configurable.

In some implementations, the controller can utilize the one or more returned metrics to index a data structure (e.g., a lookup table) mapping memory device-originated metrics to the read voltage adjustment values. Alternatively, the controller can compute the read voltage adjustment value by applying a predefined mathematical transformation to the memory device-originated metrics. In some implementations, the controller can index the data structure to determine a first read voltage adjustment during a first calibration operation, apply a predefined mathematical transformation to determine a second read voltage adjustment during a second calibration operation and/or apply another predefined mathematical transformation to determine a third read voltage adjustment during a third calibration operation. The controller can then utilize the determined read voltage adjustment value for performing subsequent read operations.

In an illustrative example, the metrics can include the failed byte count (CFByte), which reflects (i.e., is equal to or is derived by a known transformation from) the number of bytes in the sensed data that have at least one non-conducting bitline. In another illustrative example, the metrics can include the failed bit count (CFBit), which reflects (i.e., is equal to or is derived by a known transformation from) the number of non-conducting bitlines in the sensed data. Certain calibration operations performed by the memory device may use a CFByte metric and/or a CFBit metric to iteratively determine a read level voltage adjustment for reading the sensed data.

Upon performing a read strobe, the metrics characterizing the threshold voltage distributions (e.g., the failed byte count or the failed bit count) are returned by the memory devices to the memory sub-system controller or used by the local media controller in order to determine the read voltage adjustment values, which can then be utilized for performing the next read strobe. After performing each read strobe, the controller can decode the sensed data. This sequence of calibration and read operations can be iteratively performed until either the sensed data is successfully decoded (in which case no further action is needed) or a predefined maximum number of calibration operations have been performed. If the decoding operation fails, the controller utilizes the returned metrics for determining the read voltage adjustment for performing subsequent read operations with respect to the wordline to which the initial read strobe has been applied and/or to one or more neighboring wordlines of that wordline, as described in more detail herein below.

Thus, embodiments of the present disclosure improve the accuracy and efficiency of read level calibration operations. In various embodiments, the read level calibration can be performed by the media controller residing on the memory device or by the memory sub-system controller. Furthermore, the read level calibration performed in accordance with aspects of the present disclosure significantly improves the bit error rate, by tracking the voltage threshold shift caused by slow charge loss and/or temperature as well as compensating for the program and read disturb and/or physical defects of the storage media, as described in more detail herein below.

While the examples described herein involve triple level cell (TLC) voltage distributions, in various other implementations, similar techniques can be implemented for memory pages storing other numbers of bits per cell.

FIG. 1 illustrates an example computing system 100 that includes a memory sub-system 110 in accordance with some implementations of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some implementations, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some implementations, each of the memory devices 130 can include one or more arrays of memory cells such as SLCs, MLCs, TLCs, QLCs, or any combination of such. In some implementations, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some implementations, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some implementations, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some implementations, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some implementations, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a memory access manager 134 configured to carry out memory access operations, e.g., in response to receiving memory access commands from memory interface 113. In some implementations, local media controller 135 includes at least a portion of memory access manager 134 and is configured to perform the functionality described herein. In some implementations, memory access manager 134 is implemented on memory device 130 using firmware, hardware components, or a combination of the above. In an illustrative example, memory access manager 134 receives, from a requestor, such as memory interface 113, a request to read a data page of the memory device 130. A read operation can include a series of read strobes, such that each strobe applied a certain read level voltage to a chosen wordline of a memory device 130 in order to compare the estimated threshold voltages $V_T$ of a set of memory cells to one or more read levels corresponding to the expected positions of the voltage distributions of the memory cells.

In some implementations, the memory access manager 134 utilizes memory device-originated metrics characterizing voltage distributions for adjusting read voltage levels. Accordingly, the memory device 130 can, in response to a read strobe, return one or more metrics (e.g., metadata values) to the memory access manager 134. In an illustrative example, the memory device may, upon performing a read strobe, return the failed byte count (CFByte). The failed byte count reflects (i.e., is equal to or is derived by a known transformation from) the number of bytes in the sensed data that have at least one non-conducting bitline. In another illustrative example, the memory device may, upon performing a read strobe, return the failed bit count (CFBit). The failed bit count reflects (i.e., is equal to or is derived by a known transformation from) the number of non-conducting bitlines in the sensed data. In various illustrative examples, the memory device can inspect at least a part of a memory page (e.g., four or eight bitlines) when counting non-conducting bitlines.

The metrics received from the memory device in response to a read strobe can be used by the memory sub-system controller 115 or a local media controller 135 ("the controller") in order to adjust the applied read levels in order to compensate for the voltage distribution shift. Adjustments to the applied read levels can be accomplished through one or more iterative calibration operations, as described herein.

As noted herein above, in some implementations, the controller can utilize the memory device-originated metrics (e.g., metadata) characterizing voltage distributions for adjusting the read level voltage in a manner that would minimize the read operation latency while providing at least a specified accuracy of the read operation. The controller can utilize the metrics in one or more iterative red level voltage calibration operations to determine a read level voltage adjustment. Alternatively, the controller can utilize the memory device-originated metadata characterizing voltage distributions for adjusting the read level voltage in a manner that would maximize the read operation accuracy while not exceeding a specified latency of the read operation.

In some implementations, the controller can utilize one or more returned metrics to index a data structure (e.g., a lookup table) mapping memory device-originated metrics (e.g., failed byte counts or failed bit counts) to the read voltage adjustment values. Alternatively, the controller can compute the read voltage adjustment value by applying a predefined mathematical transformation to the memory device-originated metrics (e.g., failed byte counts or failed bit counts). In some implementations, the controller can index the data structure to determine a first read voltage adjustment during a first calibration operation, apply a predefined mathematical transformation to determine a second read voltage adjustment during a second calibration operation and/or apply another predefined mathematical transformation to determine a third read voltage adjustment during a third calibration operation. The controller can then utilize the determined read voltage adjustment value for performing subsequent read operations.

In an illustrative example, the controller can perform read level calibration (i.e., adjusting the read level voltages) as part of a read command flow.

After performing each read strobe, the controller can decode the sensed data. This sequence of calibration and read operations can be iteratively performed until either the sensed data is successfully decoded (in which case no further action is needed) or a predefined maximum number of steps has been performed. If the decoding operation fails, the controller utilizes the returned metrics for determining the read voltage adjustment for performing subsequent read operations with respect to the wordline to which the initial read strobe has been applied and/or to one or more neighboring wordlines of that wordline.

Figure 2:
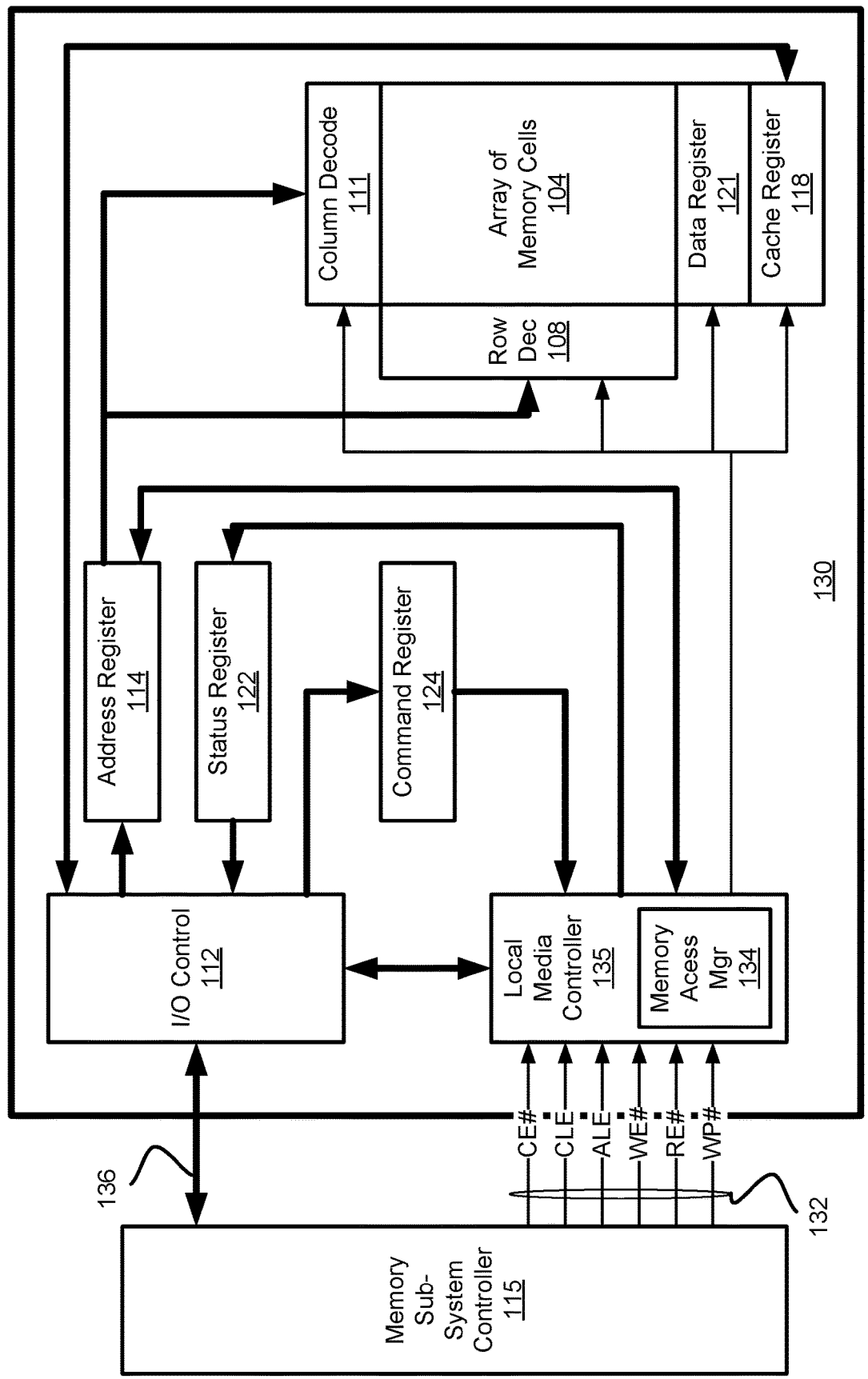
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line can be associated with more than one logical row of memory cells and a single data line can be associated with more than one logical column. Memory cells (not shown in FIG. 2) of at least a portion of array of memory cells 104 are capable of being programmed to one of at least two target data states.

Row decode circuitry 108 and column decode circuitry 111 are provided to decode address signals. Address signals are received and decoded to access the array of memory cells 204. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 108 and column decode circuitry 111 to control the row decode circuitry 108 and column decode circuitry 111 in response to the addresses. In one embodiment, local media controller 135 includes memory access manager 134, which can implement the memory programming operations with respect to memory device 130, as described herein.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a programming operation (e.g., a write operation), data can be passed from the cache register 118 to the data register 121 for transfer to the array of memory cells 204; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form a portion of) a page buffer of the memory device 130. A page buffer can further include sensing devices (not shown in FIG. 2) to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory subsystem controller 115 over a multiplexed input/output (I/O) bus 136 and outputs data to the memory sub-system controller 115 over I/O bus 136.

For example, the commands can be received over input/output (I/O) pins [7:0] of I/O bus 136 at I/O control circuitry 112 and can then be written into command register 124. The addresses can be received over input/output (I/O) pins [7:0] of I/O bus 136 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 can not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) can be used in the various embodiments.

Figure 4:
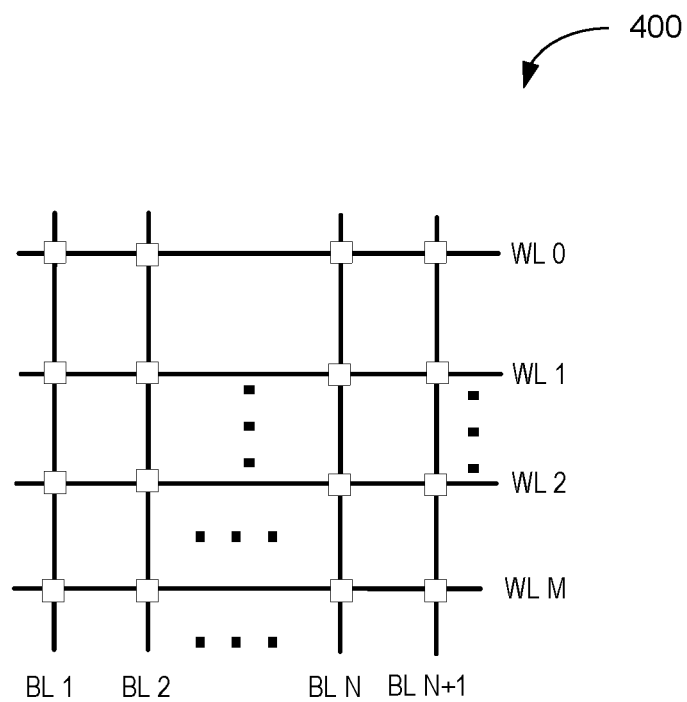
FIG. 4 schematically illustrates an example memory array.

One or more memory devices of the memory sub-system 100 can be represented, e.g., by NAND memory devices that utilize transistor arrays built on semiconductor chips. As illustrated schematically in FIG. 3A, a memory cell of a memory device can be a transistor, such as metal-oxide-semiconductor field effect transistor (MOSFET), having a source (S) electrode and a drain (D) electrode to pass electric current there through. The source and drain electrodes can be connected to a conductive bitline (BL), which can be shared by multiple memory cells. A memory device can include an array or memory cells that are connected to a plurality of wordlines (WL) and a plurality of bitlines (BL), as schematically illustrated by FIG. 4. A memory device can further include circuitry for selectively coupling WLs and BLs to voltage sources providing control gate and source-drain signals, which is omitted from FIG. 4 for clarity and conciseness.

Referring again to FIG. 3A, memory cells 302 and 304 can be connected to the same bitline N and two different conductive wordlines, M and M+1, respectively. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG} < V_T$, the source-drain electric current can be low, but can increase substantially once the control gate voltage has exceeded the threshold voltage, $V_{CG} > V_T$. Transistors of the same memory device can be characterized by a distribution of their threshold voltages, $P(V_T) = dW/dV_T$, so that $dW = P(V_T)dV_T$ represents the probability that any given transistor has its threshold voltage within the interval $[V_T, V_T + dV_T]$. For example, FIG. 3B illustrates schematically dependence of the source-drain current $I_{SD}$ on the control gate voltage for two memory cells, e.g. memory cell 302 (solid line) and memory cell 304 (dashed line), having different threshold control gate voltages.

To make a memory cell non-volatile, the cell can be further equipped with a conducting island—a charge storage node—that can be electrically isolated from the control gate, the source electrode, and the drain electrode by insulating layers (depicted in FIG. 3A as the dotted region). In response to an appropriately chosen positive (in relation to the source potential) control gate voltage $V_{CG}$, the charge storage node can receive an electric charge Q, which can be permanently stored thereon even after the power to the memory cell—and, consequently, the source-drain current—is ceased. The charge Q can affect the distribution of threshold voltages $P(V_T, Q)$. Generally, the presence of the electric charge Q shifts the distribution of threshold voltages towards higher voltages, compared with the distribution $P(V_T)$ for an uncharged charge storage node. This happens because a stronger positive control gate voltage $V_{CG}$ can be needed to overcome a negative potential of the charge storage node charge Q. If any charge of a sequence $Q_k$ of charges with $1 \leq k \leq 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N - 1$ valley margins.

FIG. 3C illustrates schematically a distribution of threshold control gate voltages for a set of memory cells capable of storing three bits of data by programming the memory cell into at least eight charge states that differ by the amount of charge on the cell's charge storage node. FIG. 3C shows distributions of threshold voltages $P(V_T, Q_k)$ for $2^N = 8$ different charge states of a tri-level cell (TLC) separated with $2^3 - 1 = 7$ valley margins $VM_k$. Accordingly, a memory cell programmed into a charge state k-th (i.e., having the charge $Q_k$ deposited on its charge storage node) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

Memory devices can be classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In general, the operations described herein can be applied to memory devices having N-bit memory cells, where N>1.

For example, a TLC can be capable of being in one of eight charging states $Q_k$ (where the first state is an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 215.

As noted herein above, the memory controller 215 can program a state of the memory cell and then read can read this state by comparing a read threshold voltage $V_T$ of the memory cell against one or more read level thresholds. The read operation can be performed after a memory cell is placed in one of its charged states by a previous programming operation, which can include one or more programming passes. Each programming pass would apply appropriate programming voltages to a given wordline in order place appropriate charges on the charge storage nodes of the memory cells that are connected to the wordline.

A programming operation involves a sequence of programming voltage pulses that are applied to a selected (target) wordline (i.e., the wordline that is electrically coupled to the target memory cells). Referring again to FIG. 3A, the source (S) and drain (D) electrodes of a memory cell can be connected to a conductive bitline shared by multiple memory cells. A programming operation would apply a sequence of programming voltage pulses to the control gate (CG) via a corresponding wordline (WL). Each programming voltage pulse would induce an electric field that would pull the electrons onto the charge storage node. After each programming pulse is applied to the selected wordline, a verify operation can be performed by reading the memory cell in order to determine whether the threshold voltage $V_T$ of the memory cell has reached a desired value (voltage verify level). If the threshold voltage $V_T$ of the memory cell has reached the verify voltage associated with the desired state, the bitline to which the memory cell is connected can be biased at the program inhibit voltage, thus inhibiting the memory cells that are coupled to the bitline from being further programmed, i.e., to prevent the threshold voltage $V_T$ of the memory cells from shifting further upward in response to subsequent programming pulses applied to the selected wordline.

Figure 5A:
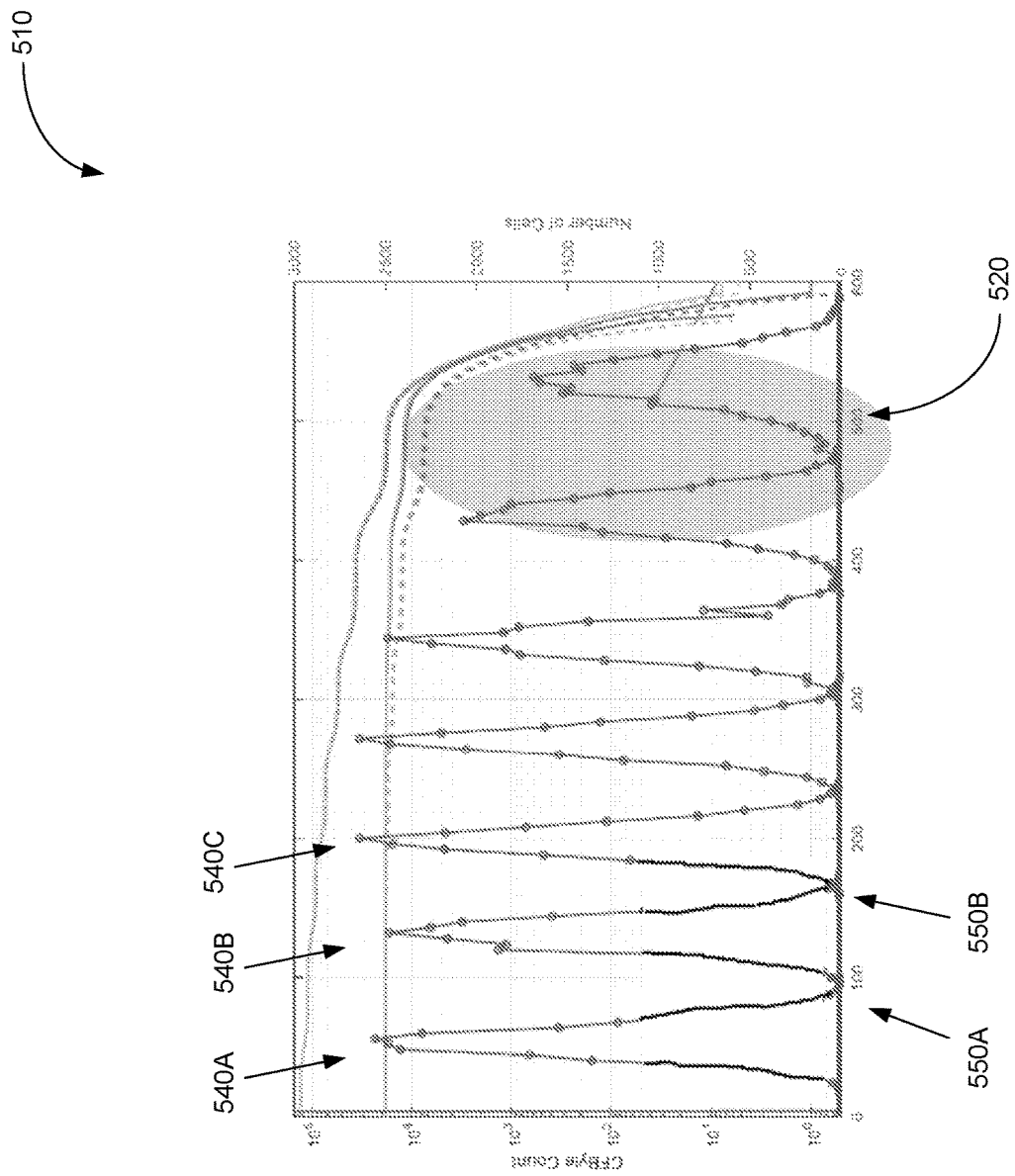
FIGS. 5A-5B schematically illustrates example threshold voltage distributions and corresponding device-originated metrics in a triple-level cell (TLC) memory page, in accordance with aspects of the present disclosure.
Figure 5B:
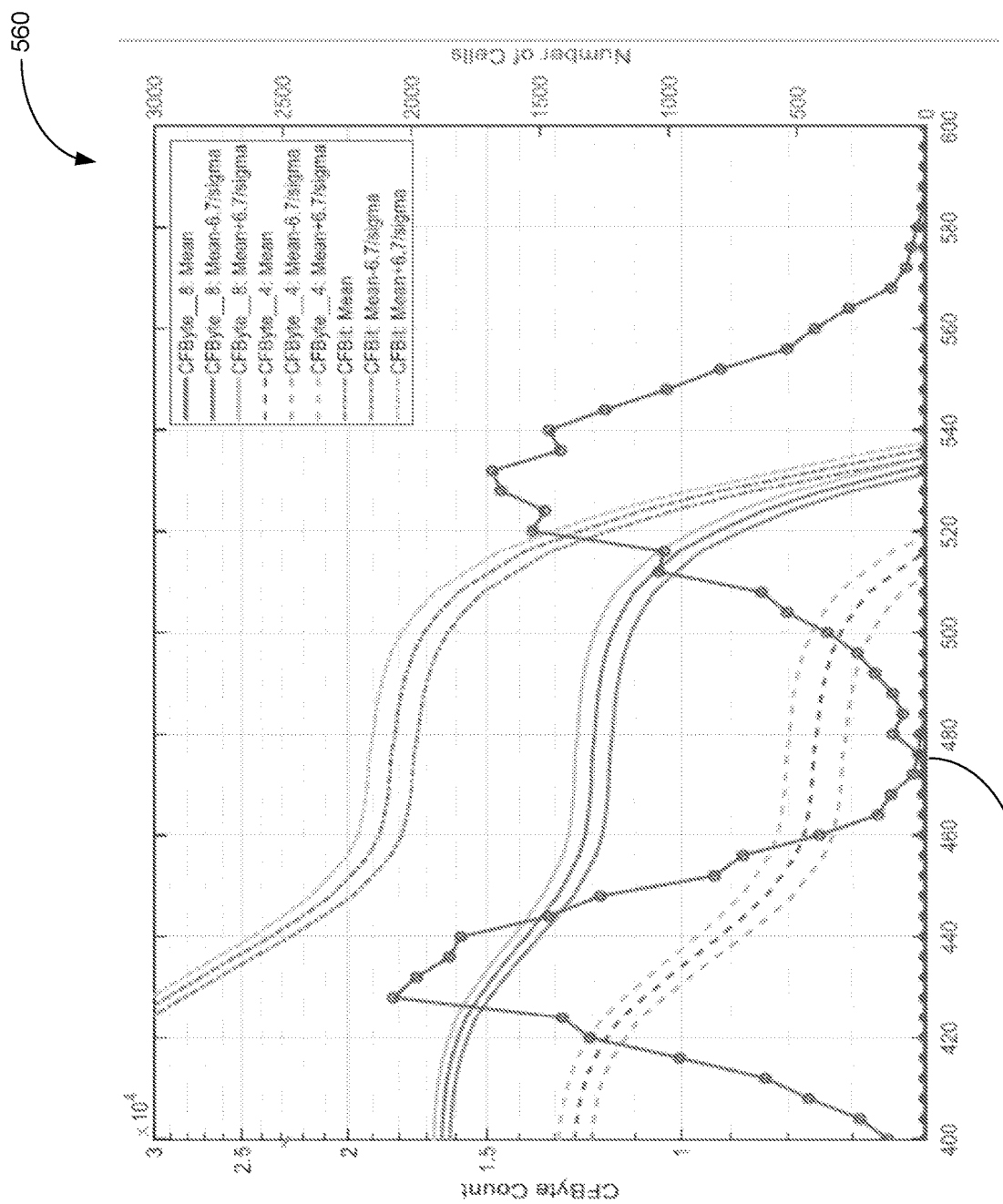

As noted herein above, the systems and methods of the present disclosure utilize certain memory device-originated metrics (e.g., metadata, failed bit counts and/or failed byte counts) for adjusting the read level voltages. FIGS. 5A-5B schematically illustrate threshold voltage distributions of a set of memory cells and corresponding metrics (the failed byte count (CFByte) and the failed bit count (CFBit)).

Each memory cell can be programmed into one or several (e.g., eight) charge states that differ by the amount of charge stored by the cell. FIG. 5A shows example distributions 540A-540C of threshold voltages $P(V_T, Q_k)$ for different TLC charge states, which are separated by respective valley margins 550A-550B. The charge state $Q_k$ of a given memory cell can be determined by a read operation by detecting that a control gate voltage $V_{CG}$ within the valley margin $VM_k$ is sufficient to open the cell to the source-drain current whereas a control gate voltage within the preceding valley margin $VM_{k-1}$ is not. Accordingly, for a given read operation, the memory sub-system controller 115 can sequentially perform two or more read strobes at the read voltage levels that correspond to the presumed positions of one or more valley margins 550.

As illustrated by FIGS. 5A-5B, the failed byte count (reflecting the number of bytes in the sensed data that have at least one non-conducting bitline) and the failed bit count (reflecting the number of non-conducting bitlines in the sensed data) have respective defined relationships with threshold voltage distributions. In an illustrative example of FIG. 5A, plot 510 schematically illustrates the dependency between the failed byte count (CFByte), the failed bit count (CFBit) and threshold voltage distributions of a set of memory cells, while plot 560 of FIG. 5B shows the detailed view of the area of interest 520 of plot 510. As can be seen from the plots 510 and 560, certain read level voltages applied to the set of memory cells would result in corresponding the failed byte count (CFByte) and/or the failed bit count (CFBit) values. Thus, the failed byte count and/or failed bit count measured at a certain read voltage level would correspond to certain numbers of memory cells that are found, within the threshold voltage distribution, below and above the read level.

Accordingly, in response to a read strobe issued by the memory sub-system controller 115, the memory device 130 can return the failed bit count and/or failed byte count together with the sensed data. The controller can evaluate a chosen data state metric on the sensed data in order to determine whether the sensed data can be successfully decoded or a threshold voltage adjustment and a subsequent new read strobe are needed. If the data is not decodable, a threshold voltage adjustment and a subsequent new read strobe may be needed. In the latter case, the controller can translate the received failed byte count and/or failed bit count values to the voltage level adjustments (e.g., via one or more iterative calibration operations). This sequence of calibration and read operations can be iteratively performed until either the sensed data is successfully decoded or a predefined maximum number of steps has been performed. The adjusted read level can then be utilized for performing subsequent read operations with respect to the wordline to which the initial read strobe has been applied and/or to one or more neighboring wordlines of that wordline.

In some implementations, the controller can utilize one or more returned metrics to index a data structure (e.g., a lookup table) mapping memory device-originated metrics (e.g., failed byte counts or failed bit counts) to the read voltage adjustment values. The data structure can be device type-specific, and can be pre-populated by analyzing memory device performance over at least a predefined number of program-erase cycles.

Alternatively, the controller can compute the read voltage adjustment value by applying a predefined mathematical transformation to the memory device-originated metrics (e.g., failed byte counts or failed bit counts). In an illustrative example, the predefined transformation can be represented by a quadratic approximation on the differences of pairs of failed bit counts measured on consecutive strobes.

In some embodiments, the controller can determine a first read voltage adjustment value by utilizing one or more returned metrics to index a data structure (e.g., a lookup table) mapping memory device-originated metrics to the read voltage adjustment values in a first calibration operation. The controller may next compute a second read voltage adjustment value by applying a first predefined mathematical transformation to the memory device-originated metrics in a second calibration operation. In some embodiments, the controller may then compute a third read voltage adjustment value by applying a second predefined mathematical transformation to the metrics in a third calibration operation. The controller may use the first read voltage adjustment value, the second read voltage adjustment value, and/or the third read voltage adjustment value for reading the data stored in the memory cells. In some examples, the controller uses an aggregation of the first read voltage adjustment value, the second read voltage adjustment value, and/or the third read voltage adjustment value for reading the data.

Figure 6:
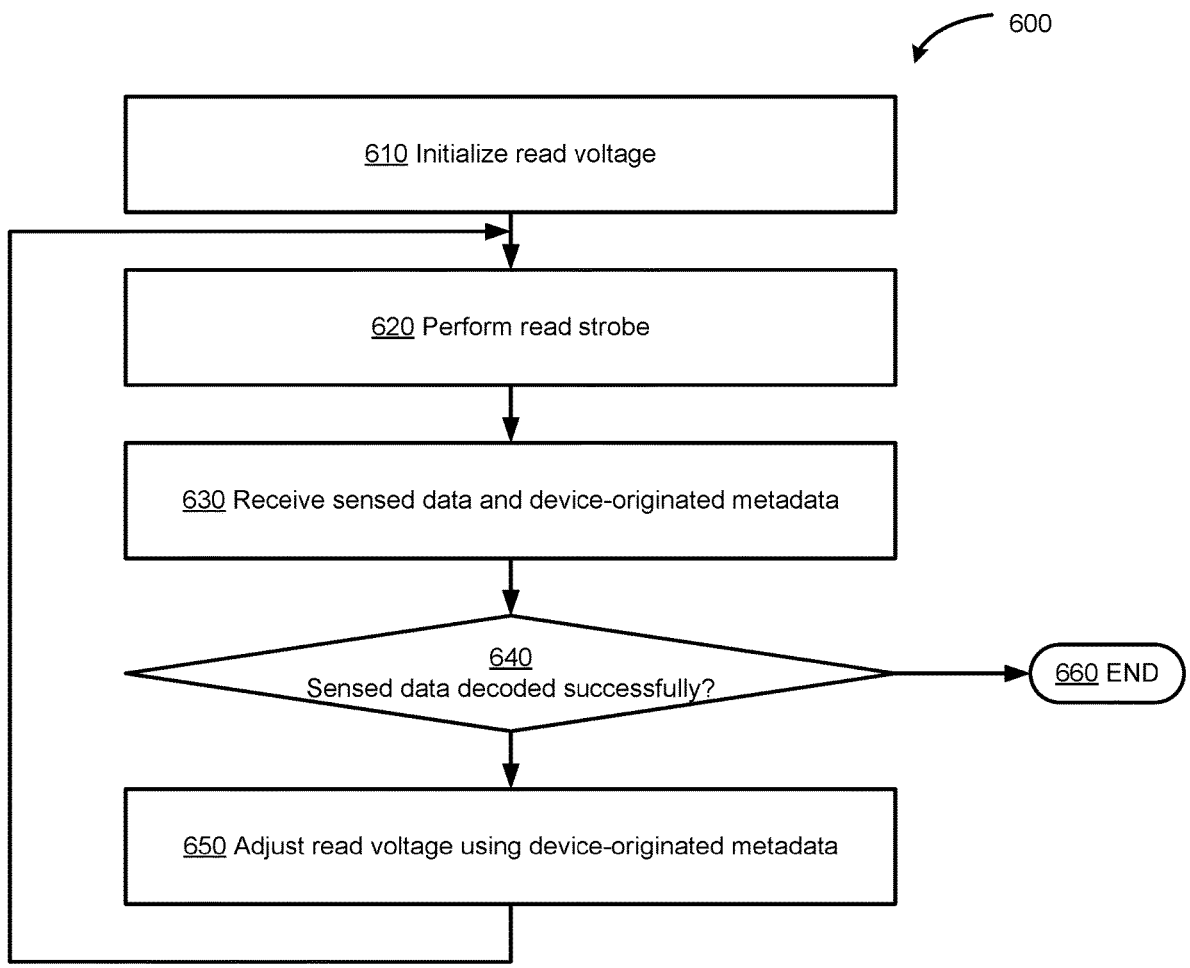
FIG. 6 is a flow diagram of an example method of calibrating read level voltage in memory devices, in accordance with embodiments of the present disclosure.

FIG. 6 is a flow diagram of an example method 600 of calibrating read level voltage in memory devices, in accordance with embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 600 is performed by the memory sub-system controller 115 and/or the local media controller 135 of FIG. 1.

In some implementations, the method 600 can be performed within a read command, in order to calibrate prior to final sensing. In some implementations, the method 600 can be performed by the media controller, and read threshold adjustment can be performed prior to final sensing of data. Thus, a single read command can involve receiving the required metadata, applying the read voltage adjustment values, and sensing the memory array to provide sensed data to be transferred via the memory interface.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 610, the controller implementing the method initializes the read voltage to be applied to a specified wordline of a memory device. The default read level voltage may be device type-specific and may be stored in the memory of the controller.

At operation 620, the controller causes a read strobe to be performed, which involves applying the chosen or adjusted read level voltage to a specified wordline of the memory device.

At operation 630, the controller receives the sensed data and the memory device-originated metadata reflecting the conductive state of one or more bitlines. The memory device-originated metadata can include, e.g., the failed byte count and/or failed bit count, as described in more detail herein.

Responsive to determining, at operation 640, that the sensed data is successfully decoded (e.g., based on a value of a chosen data state metric), the method terminates (operation 660).

Otherwise (i.e., responsive to failing, at operation 640, to successfully decode the sensed data), the controller, at operation 650, use the received memory device-originated metrics for determining read voltage adjustment values. In some implementations, the controller can utilize one or more returned metrics to index a data structure (e.g., a lookup table) mapping memory device-originated metrics (e.g., failed byte counts or failed bit counts) to the read voltage adjustment values. Alternatively, the controller can compute the read voltage adjustment value by applying a predefined mathematical transformation to the memory device-originated metrics (e.g., failed byte counts or failed bit counts).

Upon completing operation 650, the method loops back to operation 620.

Figure 7:
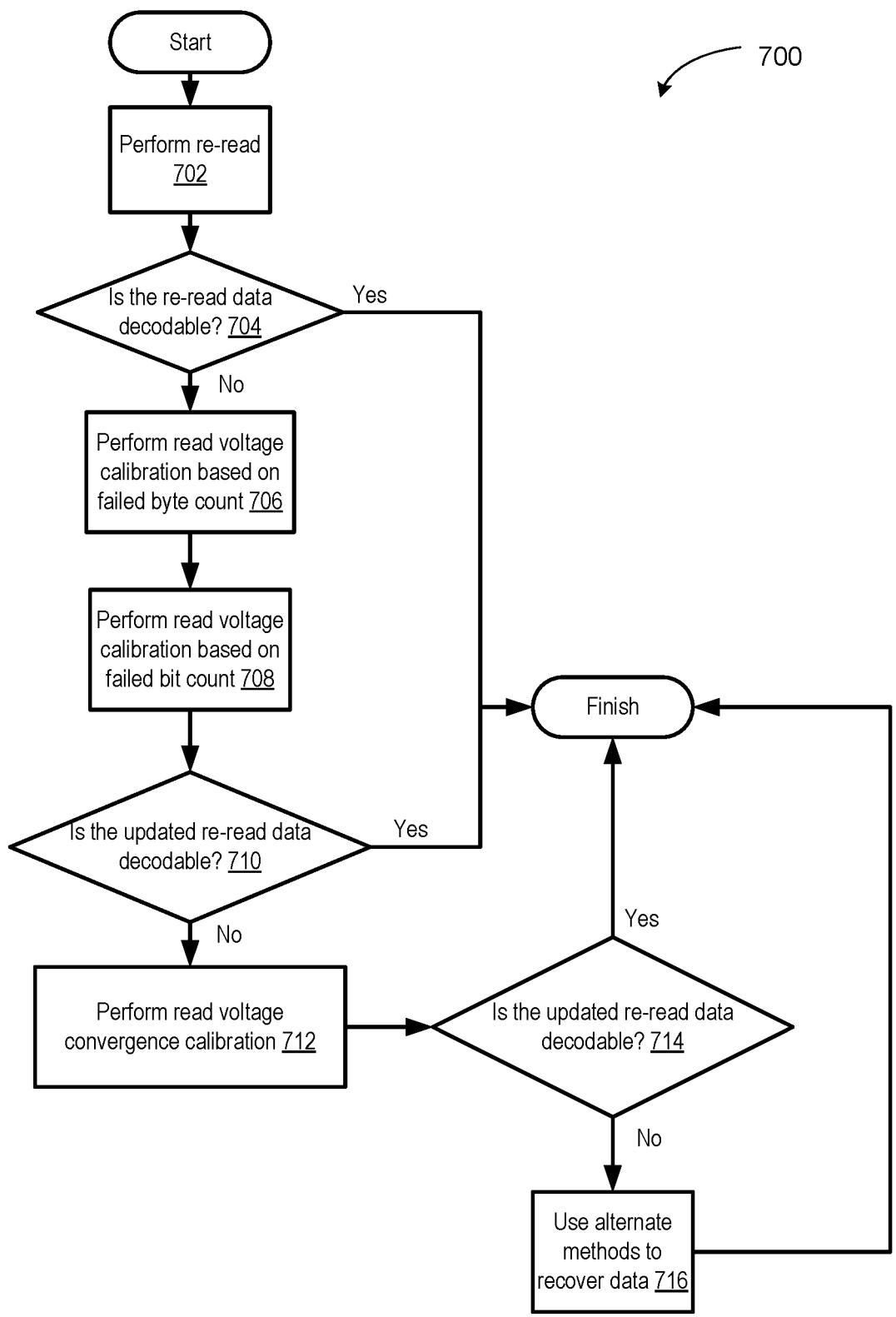
FIG. 7 is a flow diagram of an example method of calibrating read level voltage in memory devices, in accordance with embodiments of the present disclosure.

FIG. 7 is a flow diagram of an example method 700 of calibrating read level voltage in memory devices, in accordance with embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 700 is performed by the memory sub-system controller 115 and/or the local media controller 135 of FIG. 1.

In some implementations, the method 700 can be performed within a read command, in order to calibrate prior to the final sensing. In some implementations, the method 700 can be performed by the media controller, and read threshold adjustment can be performed prior to final sensing of data. Thus, a single read command can involve receiving the required metadata, applying the read voltage adjustment values, and sensing the memory array to provide sensed data to be transferred via the memory interface.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 702, the controller implementing the method 700 causes a re-read of data stored by a set of memory cells (e.g., one or more pages, addressable by a specified wordline, etc.) to be performed (e.g., subsequent to an initial read). The re-read may be performed responsive to an initial data read operation that returned non-decodable data from memory blocks of one or more wordlines. In some examples, the re-read is performed at operation 702 subsequent to detecting that data read from a memory storage location fails a quality criterion (e.g., includes more than a threshold amount of errors).

At operation 704, the controller determines whether data read during the re-read operation performed at operation 702 is decodable (e.g., satisfies a quality criterion (e.g., contains less than a threshold amount of errors). If the re-read data is decodable, the method terminates at operation 704. If the re-read data is not decodable, the method proceeds to operation 706.

At operation 706, the controller performs a read voltage calibration (e.g., the first calibration operation) based on the first chosen metric (e.g., reflecting a failed byte count, CFByte). The read voltage calibration based on the failed byte count may return a first read voltage level adjustment value as described herein. The second re-read operation using the first read voltage level adjustment value may be performed as part of operation 706. More details regarding the read voltage calibration based on the failed byte count may be described with reference to FIGS. 8A-8B.

At operation 708, the controller performs a read voltage calibration (e.g., a second calibration operation) based on the second chosen metric (e.g., reflecting a failed bit count, CFBit). The read voltage calibration based on the failed bit count may return a second read voltage level adjustment value as described herein. The third re-read operation using the second read voltage level adjustment value may be performed as part of operation 708. In some embodiments, the read voltage calibration based on the failed bit count may be iterative. For example, the read voltage calibration based on the failed bit count may be repeatedly performed until the second read voltage level adjustment value is within a predetermined range (e.g., within a predetermined tolerance of a target read voltage level). More details regarding the read voltage calibration based on the failed bit count may be described with reference to FIGS. 8A-8B.

At operation 710, the controller determines whether the re-read data (e.g., the data read at operations 706 and/or 708) is decodable (e.g., contains few errors, contains less than a threshold amount of errors, etc.). If the re-read data is decodable, the method terminates at operation 710. If the re-read data is not decodable, the method proceeds to operation 712.

At operation 712, the controller performs a read voltage convergence calibration (e.g., the third calibration operation). The read voltage convergence calibration may be based upon the second chosen metric (e.g., reflecting the failed bit count, CFBit). The read voltage convergence calibration may return the third read voltage level adjustment value as described herein. The fourth re-read operation using the third read voltage level adjustment value may be performed as part of operation 712. In some embodiments, the read voltage convergence calibration may be iterative. For example, the read voltage convergence calibration may be repeatedly performed until the third read voltage level adjustment value is within a predetermined range (e.g., within a predetermined tolerance of a target read voltage level, satisfies a threshold criterion, etc.) and/or converges on a specific read voltage level. More details regarding the read voltage convergence calibration may be described with reference to FIG. 8C and FIG. 9.

At operation 714, the controller determines whether the re-read data (e.g., the data read at operation 712) is decodable. If the re-read data is decodable, the method terminates at operation 714. If the re-read data is not decodable, the controller relies on alternate methods to recover the data at operation 716. The alternate methods to recover the data at operation 716 may be outside the scope of the present disclosure.

Figure 8A:
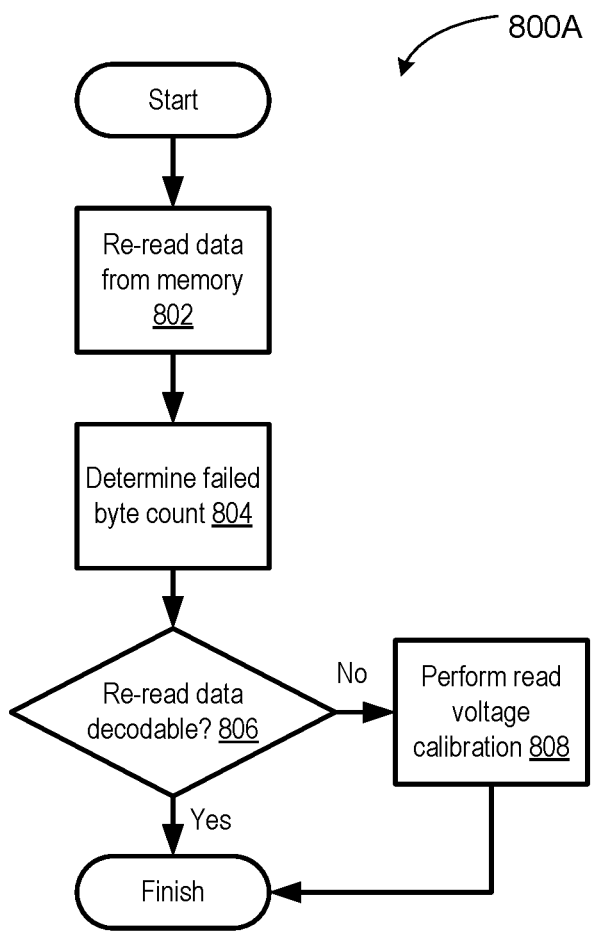
FIGS. 8A-8C are flow diagrams of example calibration operations for calibrating read level voltage in memory devices, in accordance with embodiments of the present disclosure.

FIG. 8A is a flow diagram of an example method 800A of an example calibration operation for calibrating read level voltage in memory devices, in accordance with embodiments of the present disclosure. The method 800A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 800A is performed by the memory sub-system controller 115 and/or the local media controller 135 of FIG. 1.

In some implementations, the method 800A can be performed within a read command, in order to calibrate prior to final sensing. In some implementations, method 800A is associated with one or more operations of method 700 (e.g., operation 702, operation 704, operation 706, etc.). In some implementations, the method 800A can be performed by the media controller, and read threshold adjustment can be performed prior to final sensing of data. Thus, a single read command can involve receiving the required metadata, applying the read voltage adjustment values, and sensing the memory array to provide sensed data to be transferred via the memory interface. In some embodiments, the method 800A is performed in association with method 800B of FIG. 8B and/or method 800C of FIG. 8C.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 802, the controller implementing the method 800A performs a re-read operation to re-read data from a memory (e.g., a memory storage, a memory array, one or more memory cells, a memory block, etc.). The re-read operation may be performed responsive to an initial data read from the memory not meeting a threshold criterion, (e.g., having errors, having multiple errors, having more than a threshold amount of errors, etc.). Operation 802 may correspond to operation 702 of FIG. 7.

At operation 804, the controller determines a failed byte count (e.g., CFByte) of the read data. In some embodiments, the controller determines the failed byte count based on a metric (e.g., CFBit) provided to the controller (e.g., from the memory). CFByte may be determined based on the number of bytes in the sensed data that have at least one non-conducting bitline. In some embodiments, the conductive state of one or more bitlines connected to the memory cells read at operation 802 is reflected by the failed byte count.

At operation 806, the controller determines whether the data read at operation 802 is decodable. If the data is decodable, the method terminates at operation 806. If the data is not decodable, the controller performs a read voltage calibration (e.g., the first calibration operation) at operation 808.

Figure 11A:
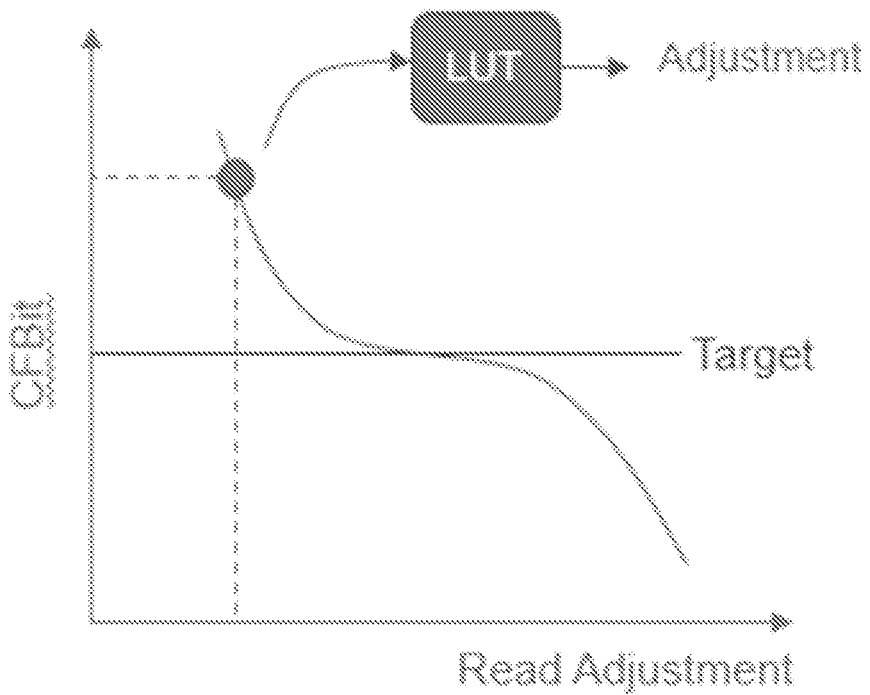
FIGS. 11A-I are diagrams illustrating methods of calibrating read level voltage in memory devices, in accordance with embodiments of the present disclosure.

At operation 808, the controller performs a read voltage calibration (e.g., the first calibration operation) to calibrate the read voltage level. The read voltage calibration may be based on the failed byte count (e.g., the first chosen metric, etc.). Referring to FIG. 11A, a diagram illustrating a method of calibrating read level voltage in memory devices is shown, in accordance with embodiments of the present disclosure. In some embodiments, the controller determines a read voltage level adjustment value (e.g., a first read voltage level adjustment value) from a data structure (e.g., a lookup table (LUT)) mapping failed byte counts to read voltage level adjustments. In some embodiments, the controller searches the data structure for an entry mapping the failed byte count to a corresponding read voltage adjustment value. The read voltage level adjustment value may be used in subsequent calibration operations described with reference to FIGS. 8B-8C. Subsequent to performing the read voltage calibration, the method may terminate at operation 808 (e.g., after further read voltage calibration and data re-read, etc.).

Figure 8B:
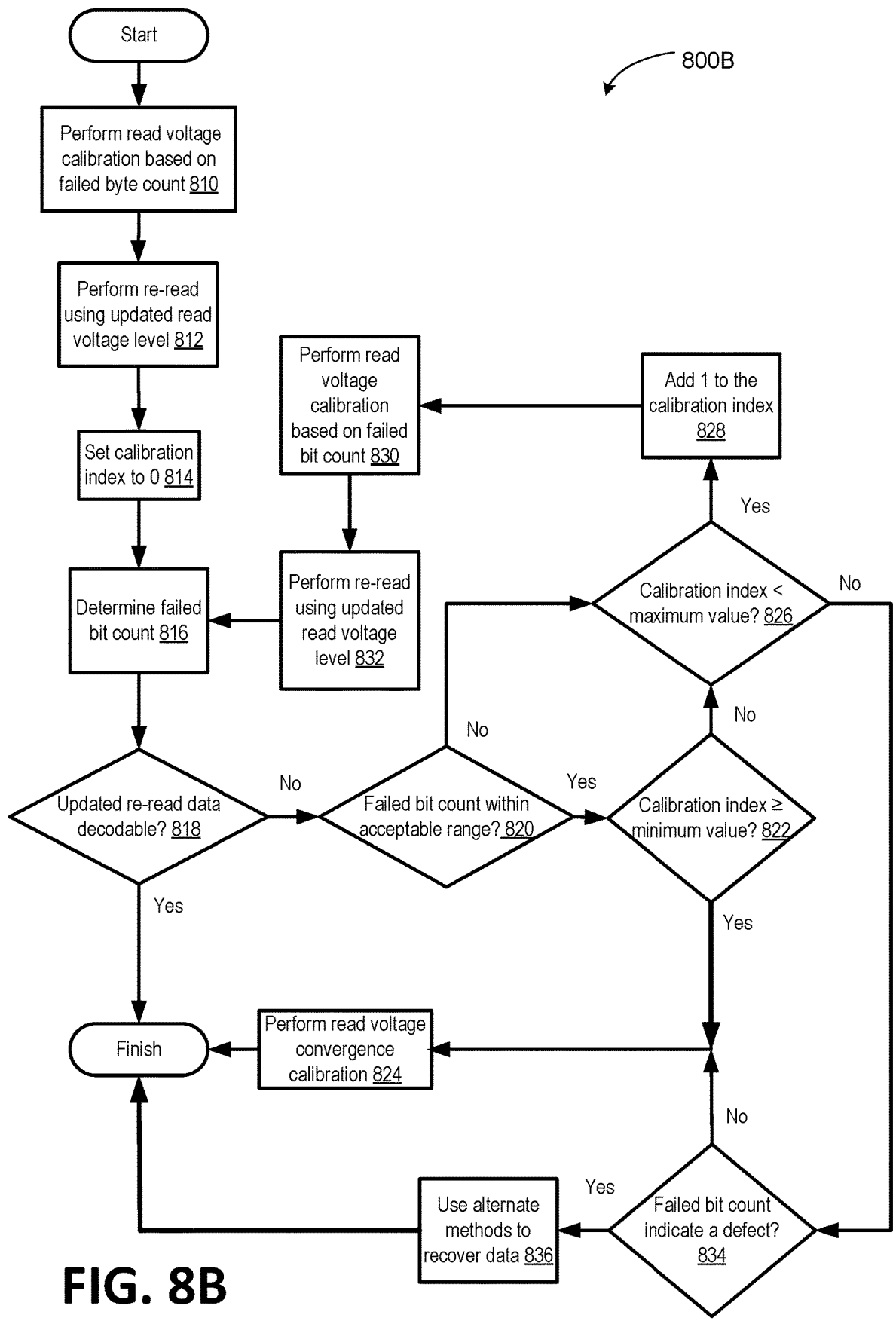

FIG. 8B is a flow diagram of an example method 800B of an example calibration operation for calibrating read level voltage in memory devices, in accordance with embodiments of the present disclosure. The method 800B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 800B is performed by the memory sub-system controller 115 and/or the local media controller 135 of FIG. 1.

In some implementations, the method 800B can be performed within a read command, in order to calibrate prior to final sensing. In some implementations, method 800B is associated with one or more operations of method 700 (e.g., operation 706, operation 708, operation 710, etc.) and/or one or more operation of method 800A (e.g., operation 808, etc.). In some implementations, the method 800B can be performed by the media controller, and read threshold adjustment can be performed prior to final sensing of data. Thus, a single read command can involve receiving the required metadata, applying the read voltage adjustment values, and sensing the memory array to provide sensed data to be transferred via the memory interface. In some embodiments, the method 800B is performed in association with method 800A of FIG. 8A and/or method 800C of FIG. 8C.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 810, the controller implementing the method 800B performs a read voltage calibration (e.g., a first calibration operation) based on failed byte count (e.g., CFByte, the first chosen metric, etc.). In some embodiments, the read voltage calibration based on failed byte count is similar (e.g., substantially similar, the same as, etc.) to the read voltage calibration performed at operation 808 with reference to FIG. 8A. The read voltage calibration based on the failed byte count may return a first read voltage adjustment value.

At operation 812, the controller performs a re-read of data using the adjusted (e.g., updated) read voltage level based on the first read voltage adjustment value.

At operation 814, the controller initializes the calibration index. As discussed herein, the read voltage calibration may be iterative. The calibration index may reflect the number of calibration iterations performed with respect to the data stored at the set of memory cells (e.g., one or more pages, addressable by a specified wordline, etc.).

At operation 816, the controller determines a failed bit count (e.g., CFBit). In some embodiments, the controller determines the failed bit count based on a metric (e.g., CFBit) provided to the controller (e.g., from the memory). CFBit may be determined based on the number of bits in the sensed data that have at least one non-conducting bitline. In some embodiments, the conductive state of one or more bitlines connected to the memory cells read at operation 812 is reflected by the failed bit count.

At operation 818, the controller determines whether the data sensed at operation 812 is decodable (e.g., has no errors, has few errors, has less than a threshold amount of errors, satisfies a threshold criterion, etc.). The data may have been read using the first read voltage adjustment value, as described herein. If the data is decodable, the method terminates at operation 818. If the data is not decodable, the method proceeds to operation 820.

At operation 820, the controller determines whether the failed bit count (e.g., CFBit) is within a predetermined acceptable range (e.g., whether CFBit is below an error threshold, satisfies a threshold criterion, etc.). If the failed bit count is within the predetermined acceptable range, the method proceeds to operation 822. If the failed bit count is not within the predetermined acceptable range, the method proceeds to operation 826.

At operation 822, the controller determines whether the calibration index is greater than or equal to a predetermined minimum calibration iteration value. The minimum calibration iteration value may reflect the minimum number of iterations that are to be performed with respect to calibrating the read level voltage based on the failed bit count (e.g., based on CFBit). In some embodiments, the minimum calibration iteration value is set in the firmware of the memory device. If the calibration index is less than the predetermined minimum calibration iteration value, the method proceeds to operation 826. If the calibration index is greater than or equal to the predetermined minimum calibration iteration value, the method proceeds to operation 824.

At operation 824, the controller performs a read voltage convergence calibration. More details regarding the read voltage convergence calibration may be discussed herein below with reference to FIG. 8C and FIG. 9. After performing the read voltage convergence calibration, the method may be finished.

At operation 826, the controller determines whether the calibration index is less than a predetermined maximum calibration iteration value. The maximum calibration iteration value may reflect a set maximum number of iterations that are to be performed with respect to calibrating the read level voltage based on the failed bit count (e.g., based on CFBit). In some embodiments, the maximum calibration iteration value is set in the firmware of the memory device. If the calibration index is less than the maximum calibration iteration value, the method proceeds to operation 828. If the calibration index is greater than or equal to the maximum calibration iteration value, the method proceeds to operation 834.

At operation 828, the controller increases the calibration index by 1 (e.g., the calibration index is increased by 1 from 0 to 1, from 1 to 2, or from 2 to 3, etc.).

Figure 11B:
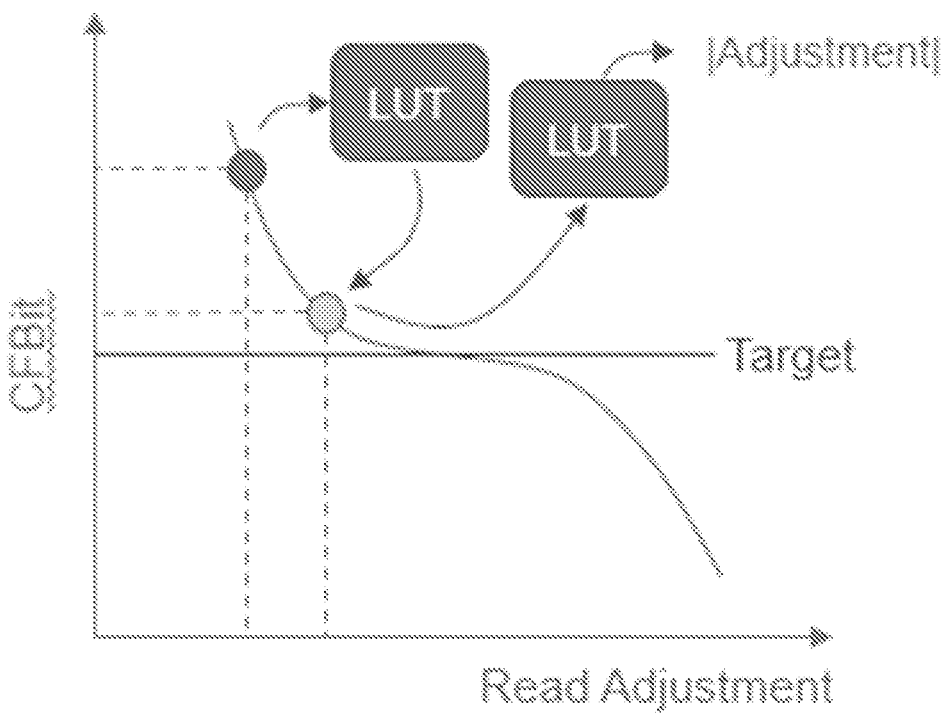
Figure 11C:
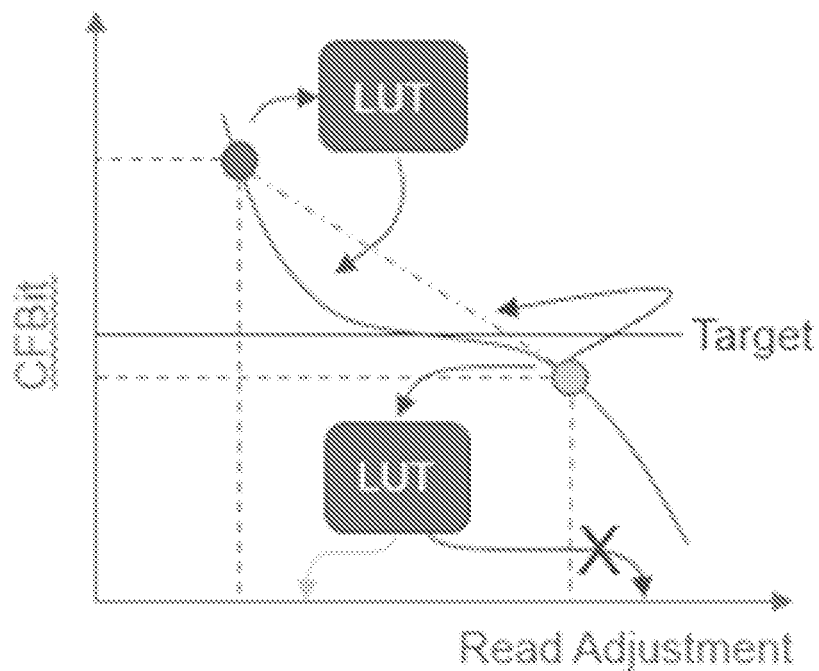

At operation 830, the controller performs a read voltage calibration based on the failed bit count (e.g., the second calibration operation, based on the second chosen metric, etc.). In some embodiments, a predetermined mathematical transform may be applied to the failed bit count to determine a read voltage adjustment value (e.g., a second read voltage adjustment value). In some embodiments, a data structure (e.g., a look-up table (LUT)) mapping failed bit counts to read voltage adjustment values is indexed based on the failed bit count to determine the read voltage adjustment value (e.g., the second read voltage adjustment value). The read voltage adjustment value may be applied to the read voltage level based on a target failed bit count (e.g., based on a relationship between the read voltage adjustment value, the read voltage level, and/or CFBit). Referring to FIGS. 11B-11C, diagrams illustrating methods of calibrating read level voltage in memory devices are shown, in accordance with embodiments of the present disclosure. Where previous CFBit measurements are on the same side of the target CFBit (e.g., both larger than the target, both smaller than the target, etc.), as shown in FIG. 11B, the read level voltage adjustment (e.g., the absolute value of the read level voltage adjustment) may be determined from the LUT. The read level voltage adjustment may be added to the last read level voltage (e.g., the lighter-colored dot) when the CFBit measurements are greater than the target, as shown in FIG. 11B. The read level voltage adjustment may be subtracted from the last read level voltage (e.g., the lighter-colored dot) when the CFBit measurements are less than the target, opposite to as shown in FIG. 11B. Where previous CFBit measurements are on different sides of the target CFBit (e.g., one larger than the target the other smaller than the target) as shown in FIG. 11C, the read level voltage adjustment may be determined from the LUT. If the adjustment determined from the LUT is not consistent with previous adjustments (e.g., implementing the adjustment from the LUT moves the read voltage level away from the target, as shown in FIG. 11C etc.), linear interpolation may be used to determine the read voltage adjustment, as shown in FIG. 11C.

Referring again to FIG. 8B, at operation 832, the controller performs a re-read of the data using the adjusted (e.g., updated) read voltage level based on the read voltage adjustment value (e.g., based on the second read voltage adjustment value and/or based on the first read voltage adjustment value). The method then loops back to operation 816 where the controller determines the failed bit count of the data sensed at operation 832.

At operation 834, the controller determines whether the failed bit count (e.g., CFbit) indicates a defect. A defect may exist in the memory device (e.g., in one or more memory cells of the memory device, in one or more wordlines of the memory device, in one or more bitlines of the memory device, etc.). The controller may determine whether the failed bit count exceeds a predetermined threshold, where the threshold is indicative of a defect in the memory device. If the controller determines that the failed bit count does not indicate a defect, the method proceeds to operation 824. If the controller determines that the failed bit count indicates a defect, the method proceeds to operation 836.

At operation 836, responsive to determining that a defect may exist in the memory device (e.g., at operation 834), the controller performs alternate methods to recover the data. The alternate methods to be performed may be of the present disclosure.

Figure 8C:
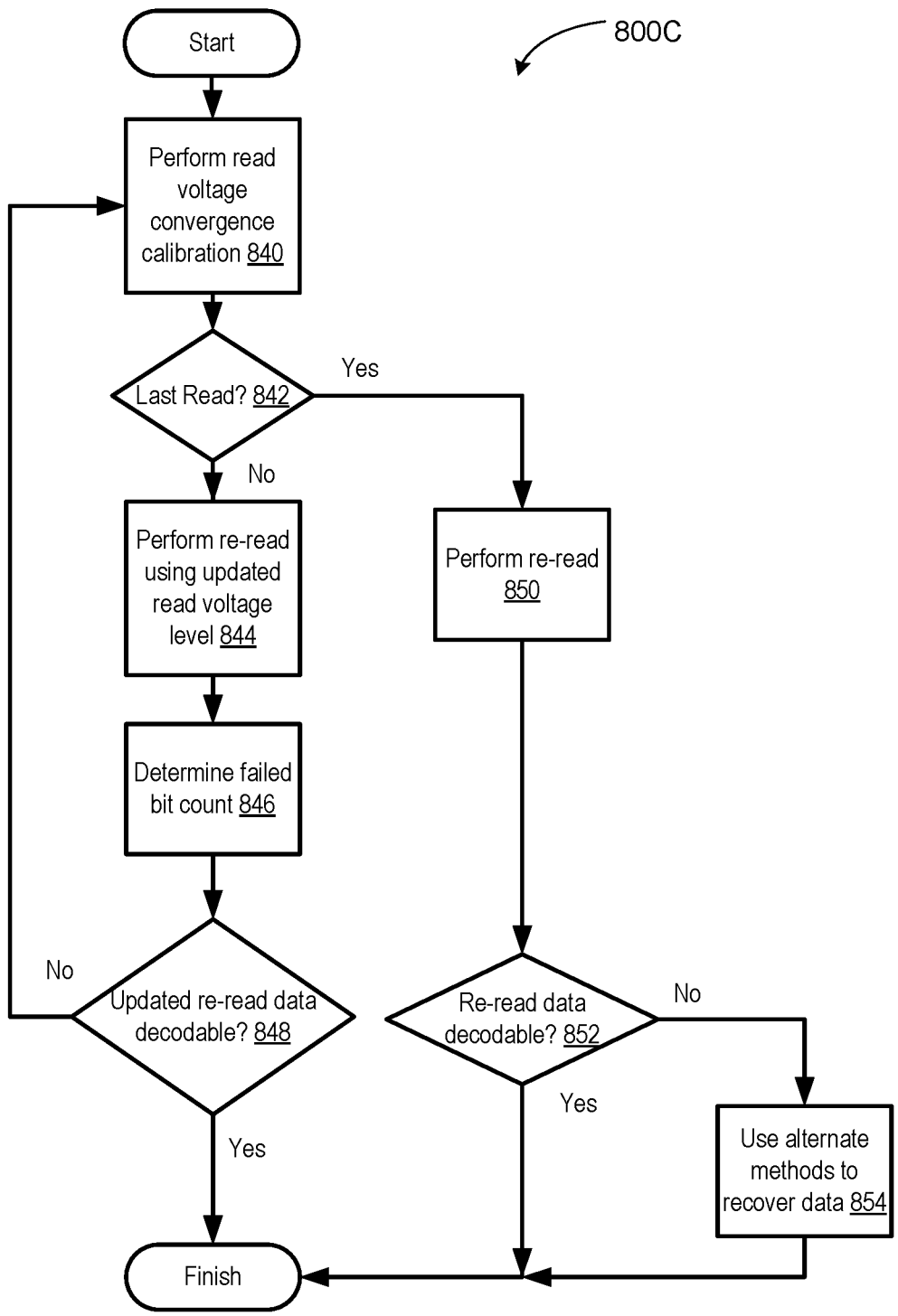

FIG. 8C is a flow diagram of an example method 800C of an example calibration operation for calibrating read level voltage in memory devices, in accordance with embodiments of the present disclosure. The method 800C can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 800C is performed by the memory sub-system controller 115 and/or the local media controller 135 of FIG. 1.

In some implementations, the method 800C can be performed within a read command, in order to calibrate prior to final sensing. In some implementations, method 800C is associated with one or more operations of method 700 (e.g., operation 712, operation 714, etc.). In some implementations, the method 800C can be performed by the media controller, and read threshold adjustment can be performed prior to final sensing of data. Thus, a single read command can involve receiving the required metadata, applying the read voltage adjustment values, and sensing the memory array to provide sensed data to be transferred via the memory interface. In some embodiments, the method 800C is performed in association with method 800A of FIG. 8A and/or method 800B of FIG. 8B.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 840, the controller implementing the method 800C performs a read voltage convergence calibration. In some embodiments, operation 840 may correspond to operation 824 of FIG. 8B and/or operation 712 of FIG. 7. In some embodiments, a predetermined mathematical transform may be applied to the failed bit count (e.g., determined at operation 816 of FIG. 8B) to determine a read voltage adjustment value (e.g., a third read voltage adjustment value). In some embodiments, a data structure (e.g., a look-up table) mapping failed bit counts to read voltage adjustment values is indexed based on the failed bit count to determine the read voltage adjustment value (e.g., the third read voltage adjustment value). The read voltage adjustment value may be applied to the read voltage level based on a target failed bit count (e.g., based on a relationship between the read voltage adjustment value, the read voltage level, and/or CFBit).

The read voltage convergence calibration may be performed to determine one or more local minima of a differentiated failed bit count. For example, the read voltage adjustment value determined at operation 840 may correspond to a local minima of the differential of CFBit relative to the read voltage level. In some examples, linear interpolation is performed to determine a read voltage adjustment value (e.g., the third read voltage adjustment value) based on values of CFBit determined at earlier calibration operations (e.g., the second calibration operation performed at operation 816 of FIG. 8B). In some embodiments, multiple values of the failed bit count determined through multiple iterations of the read voltage calibration operation based on failed bit count (e.g., performed at operation 830 of FIG. 8B) are used to determine one or more local minima of the failed bit count. The local minima of the failed bit count may correspond to the read voltage adjustment value (e.g., the third read voltage adjustment value). In some embodiments, the local minima of the failed bit count may correspond to a convergence of the read voltage level (e.g., an optimized read voltage level). The read voltage adjustment value (e.g., the third read voltage adjustment value) may be determined based on the local minima of the failed bit count. In some examples, the read voltage level is adjusted based on the difference of the local minima of the failed bit count and the predetermined target of the failed bit count. More details regarding the read voltage convergence calibration may be described herein below with respect to FIG. 9.

At operation 842, the controller determines whether the next subsequent read operation is to be the final read operation. If the next subsequent read operation is to be the final read operation, the method proceeds to operation 850. If the next subsequent read operation is not to be the final read operation, the method proceeds to operation 844.

At operation 844, the controller performs a re-read operation with respect to the memory cells. The re-read operation is performed using an adjusted (e.g., updated) read voltage level based on the read voltage adjustment value (e.g., the third read voltage adjustment value) determined as part of the read voltage convergence calibration (e.g., the third calibration operation).

At operation 846, the controller determines the failed bit count (e.g., CFBit) associated with the data sensed at operation 844. The failed bit count may be used in the next subsequent read voltage convergence calibration (e.g., a subsequent iteration of operation 840).

At operation 848, the controller determines whether the re-read data (e.g., the data sensed at operation 844) is decodable (e.g., contains few errors, contains less than a threshold amount of errors, satisfies a threshold criterion, etc.). If the data is decodable, the method terminates at operation 848. If the data is not decodable, the method loops back to operation 840 where another read voltage convergence calibration operation is performed.

At operation 850, the controller performs a re-read of the data.

At operation 852, the controller determines whether the data sensed at operation 850 is decodable. If the data is decodable, the method terminates at operation 825. If the data is not decodable, the controller causes alternate methods to be performed to recover the data at operation 854. Subsequent to performing the alternate methods to recover the data, the method terminates at operation 854. The alternate methods to recover the data may be outside the scope of the instant disclosure.

Figure 9:
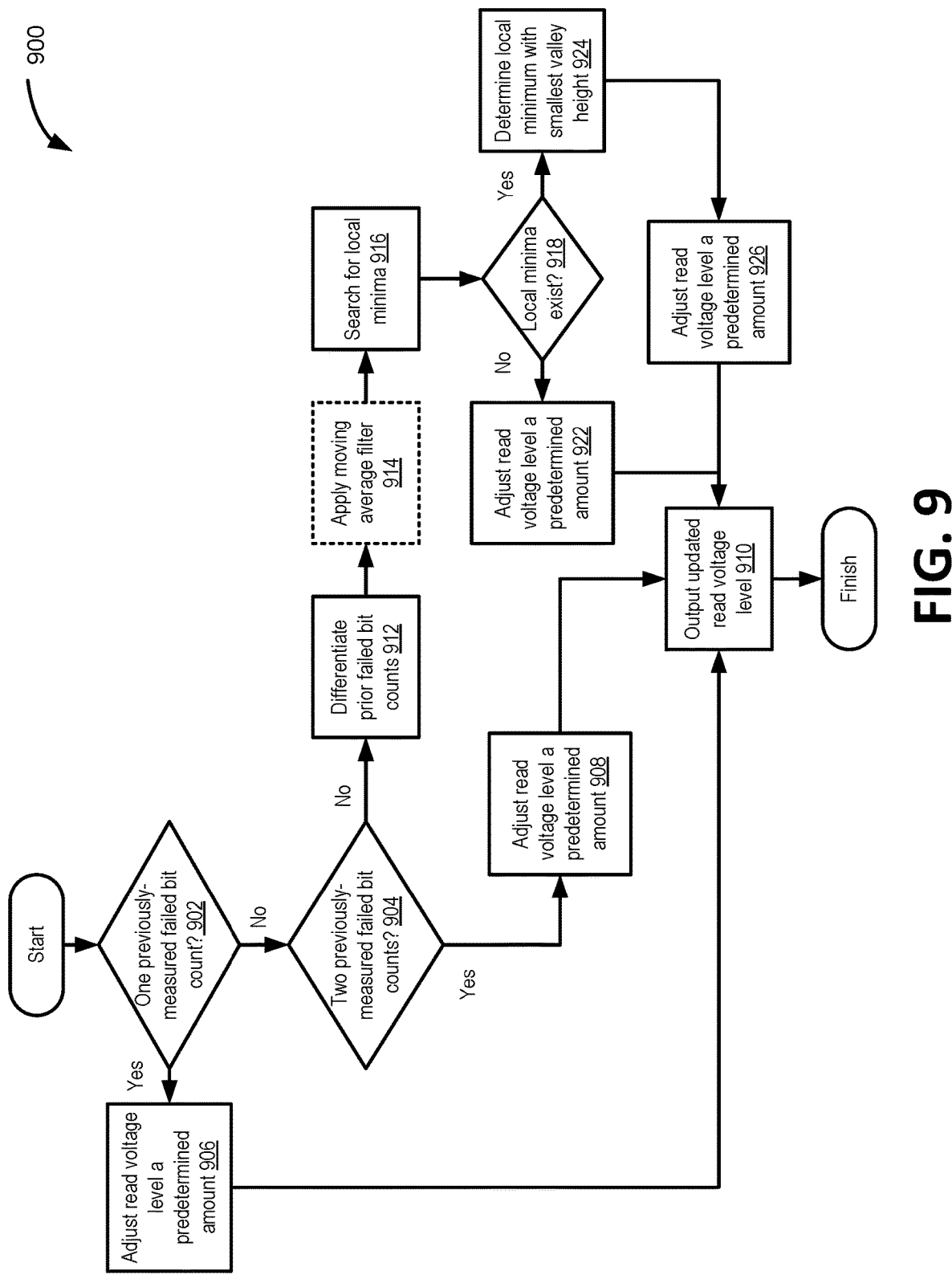
FIG. 9 is a flow diagram of an example calibration operation for calibrating read level voltage in memory devices, in accordance with embodiments of the present disclosure.

FIG. 9 is a flow diagram of an example method 900 of an example calibration operation for calibrating read level voltage in memory devices, in accordance with embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 900 is performed by the memory sub-system controller 115 and/or the local media controller 135 of FIG. 1.

In some implementations, the method 900 can be performed within a read command, in order to calibrate prior to final sensing. In some implementations, the method 900 can be performed by the media controller, and read threshold adjustment can be performed prior to final sensing of data. Thus, a single read command can involve receiving the required metadata, applying the read voltage adjustment values, and sensing the memory array to provide sensed data to be transferred via the memory interface. In some embodiments, the method 900 is performed in association with method 800A of FIG. 8A, method 800B of FIG. 8B, and/or method 800C of FIG. 8C.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 902, the controller implementing the method 900 may determine whether there has been only one previously-measured failed bit count (e.g., CFBit, second chosen metric, etc.) value. The previously-measured failed bit count may have been determined during an operation related to a read voltage calibration based on failed bit count (e.g., at operation 816 of FIG. 8B). If the controller determines that there is only one previously-measured failed bit count, the method proceeds to operation 906. If the controller determines that there are two or more previously-measured failed bit counts (e.g., that there is more than one previously-measured failed bit count), the method proceeds to operation 904.

At operation 904, the controller determines whether there are only two previously-measured failed bit count values. The previously-measured failed bit counts may have been determined during multiple operations related to multiple iterations of a read voltage calibration based on failed bit count (e.g., during iterations of operation 816 of FIG. 8B and/or operation 846 of FIG. 8C). If the controller determines that there are not only two previously-measured failed bit counts (e.g., that there are more than two previously-measured failed bit counts), the method proceeds to operation 912. If the controller determines that there are only two previously-measured failed bit counts, the method proceeds to operation 908.

Figure 11D:
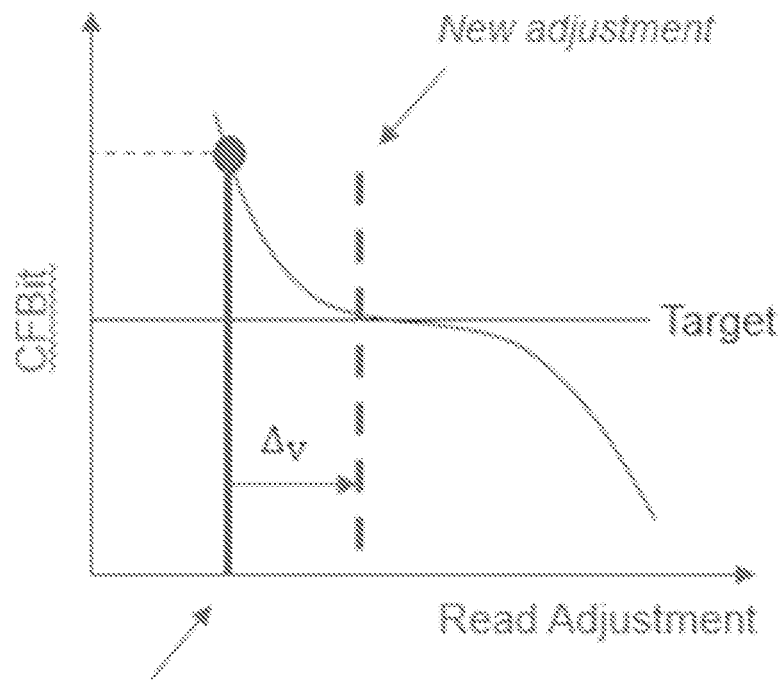
Figure 11E:
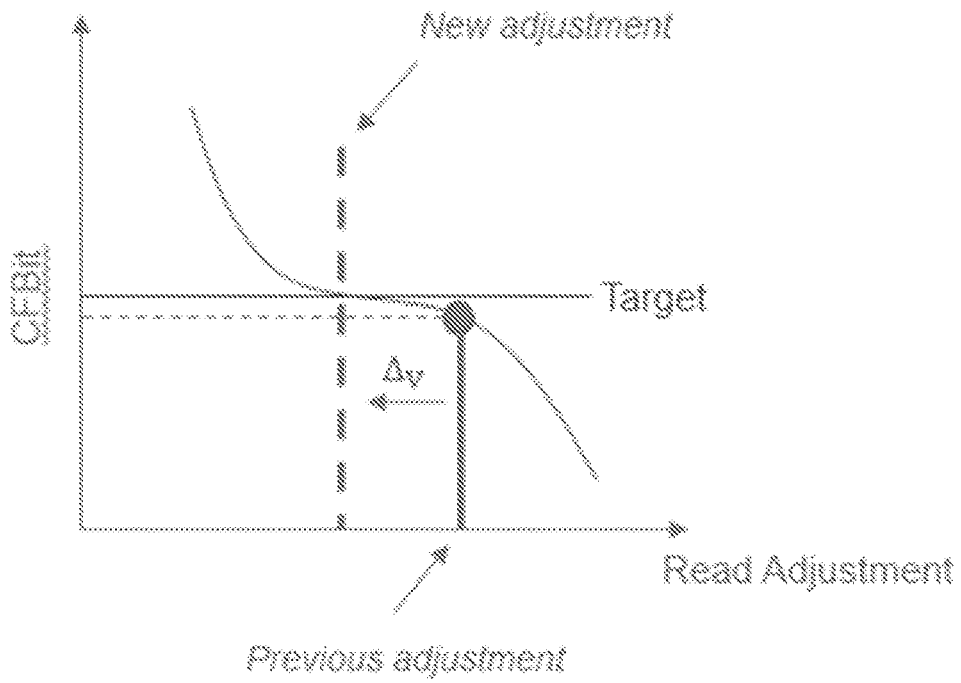

At operation 906, the controller adjusts the read voltage level by a predetermined amount (e.g., $\Delta V$), which can be specified as a parameter of the method (e.g., retrieved from the metadata area of the memory device). The read voltage level may be adjusted to correspond with increasing or decreasing the failed bit count toward the predetermined target failed bit count. Referring to FIG. 11D, a diagram illustrating a method of calibrating read level voltage in memory device is shown in accordance with embodiments of the present disclosure. Where the failed bit count is higher than the target failed bit count, the read voltage level may be increased by $\Delta V$, as shown in FIG. 11D. Similarly, referring to FIG. 11E, a diagram illustrating a method of calibrating read level voltage in memory device is shown in accordance with embodiments of the present disclosure. Where the failed bit count is lower than the target failed bit count, the read voltage level may be decreased by $\Delta V$, as shown in FIG. 11E.

Figure 11F:
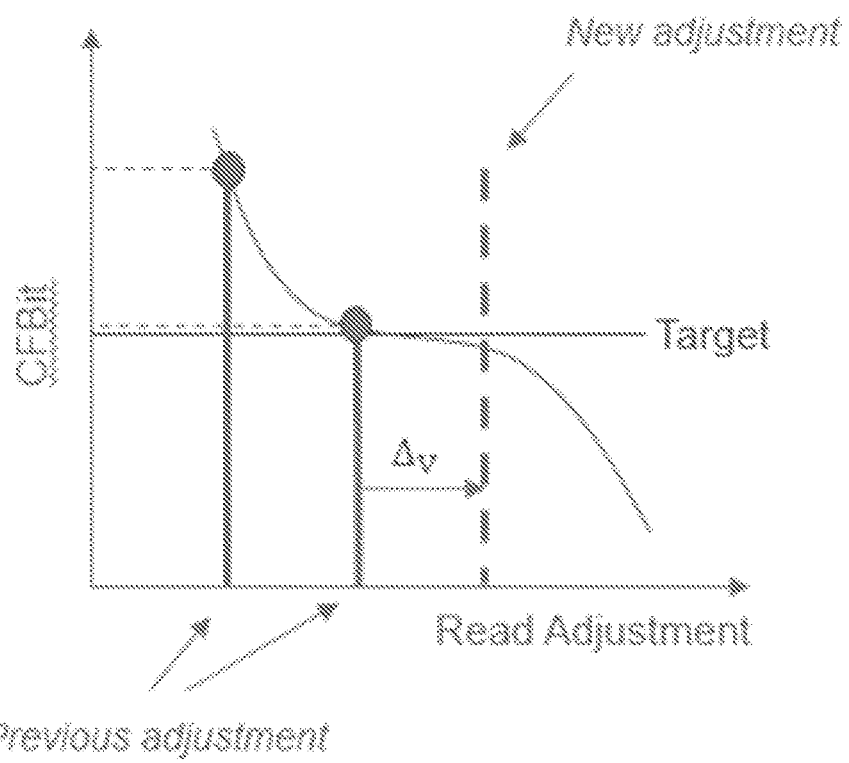
Figure 11G:
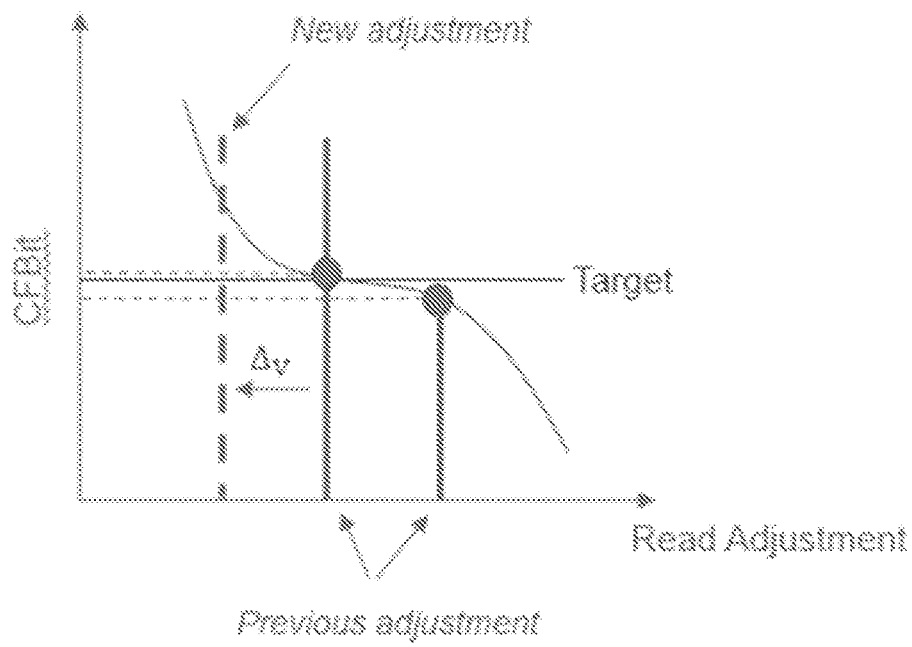

Referring again to FIG. 9, at operation 908, the controller may adjust the read voltage level by the predetermined amount (e.g., $\Delta V$). Whether the predetermined amount is added to or subtracted from the read voltage level may be dependent upon the prior two measurements of the failed bit count in relation to the target failed bit count. Referring to FIGS. 11F-11G, diagrams illustrating methods of calibrating read level voltage in memory devices are shown in accordance with embodiments of the present disclosure. Where the two prior CFBit measurements are greater than the target CFBit, $\Delta V$ may be added to the read voltage level that corresponds to the prior measure of CFBit that most closely matches the target CFBit to form the adjusted read voltage level, as shown in FIG. 11F. Similarly, where the two prior CFBit measurements are less than the target CFBit, $\Delta V$ may be subtracted from the read voltage level that corresponds to the prior measure of CFBit that most closely matches the target CFBit to form the adjusted read voltage level, as shown in FIG. 11G. In a further example, where one CFBit measurement is less than the target CFBit and the other CFBit measurement is greater than the target CFBit and the greater CFBit measurement most closely matches the target CFBit, $\Delta V$ is subtracted from the read voltage level that corresponds to the greater CFBit measurement to form the adjusted read voltage level. Similar to the immediately previous example, where the lesser CFBit measurement most closely matches the target CFBit, $\Delta V$ is added to the read voltage level that corresponds to the lesser CFBit measurement to form the adjusted read voltage level.

At operation 910, the controller may output the adjusted read voltage level. The adjusted read voltage level may be used for reading data stored in the memory cells.

At operation 912, the controller may differentiate (e.g., determine differences of) the prior failed bit counts (e.g., prior measurements of CFBit determined at operation 816 of FIG. 8B and/or at operation 846 of FIG. 8C, the second chosen metric, etc.). For example, the controller may cause the differences between prior measurements of CFBit to be determined. In some embodiments, the controller determines the absolute value of the differentiated prior failed bit counts.

At operation 914, optionally, the controller may apply a moving average filter to the differentiated failed bit counts determined at operation 912 (e.g., to the absolute values of the differentiated failed bit counts). Alternatively, another filter may be applied to eliminate (e.g., substantially eliminate) noise in the failed bit count measurements.

At operation 916, the controller may search for local failed bit count minima. For example, a local failed bit count minimum may correspond to the minimum value of the differentiated CFBit measurements (e.g., the minimum absolute value of the differentiated CFBit measurements).

Figure 11H:
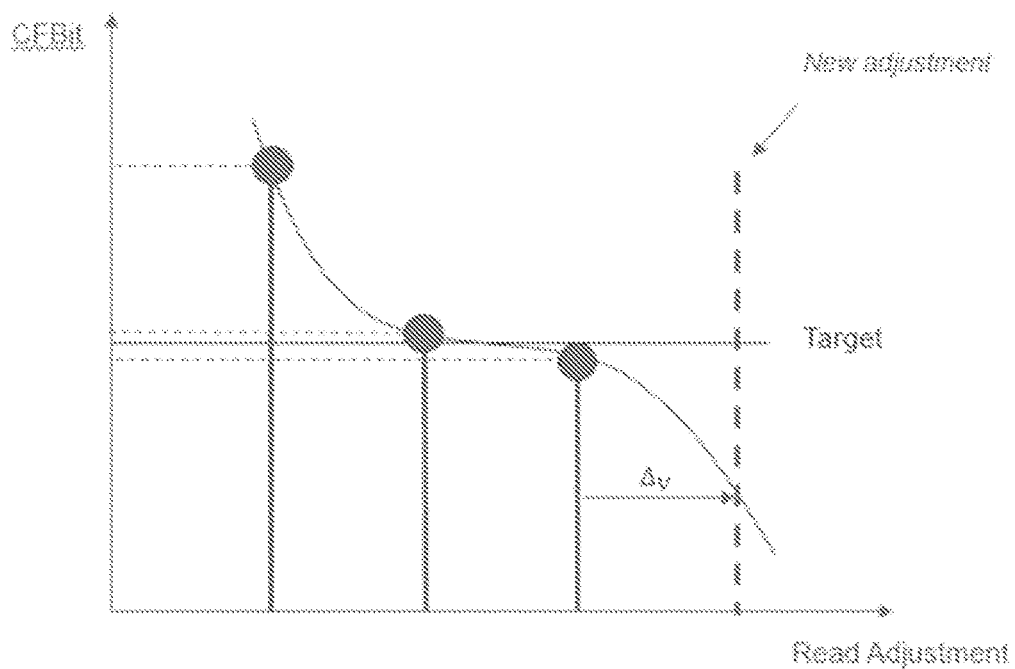
Figure 11I:
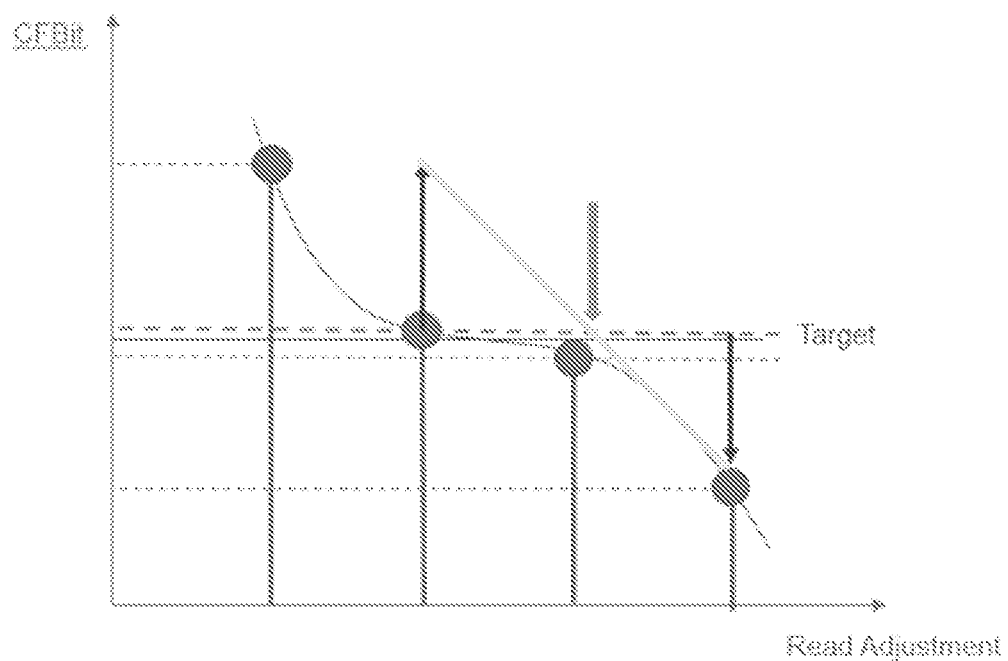

At operation 918, the controller may determine whether a local minimum exists. Referring to FIG. 11I, a diagram illustrating a method of calibrating read level voltage in memory devices is shown, in accordance with embodiments of the present disclosure. In some examples, four read strobes are performed before a local minimum can be found. The four read strobes may correspond to three values of differentiated failed bit counts. In some examples, a local minimum may exist when the differentiated failed bit count decreases with increasing read voltage level to a minimum, then increases with increasing read voltage level, as shown in FIG. 11I. A local minimum may correspond to the solid dot nearest the downward pointing arrow shown in FIG. 11I. In some examples, a local minimum may exist when the differentiated failed bit count increases with increasing read voltage level. In some examples, a local minima may exist when there exists a minimum value of the differentiated failed bit count. In some examples, a local minima may exist when the differentiated failed bit count is constant. If a local minima exists, the method may proceed to operation 924. If no local minima exists, the method may proceed to operation 922.

Referring back to FIG. 9, at operation 922, the controller may adjust the read voltage level a predetermined amount (e.g., $\Delta V$). Referring to FIG. 11H, a diagram illustrating a method of calibrating read level voltage in memory devices is shown, in accordance with embodiments of the present disclosure. In some examples, where the measure of CFBit decreases with increased read voltage level, $\Delta V$ is added to the highest previous read voltage level to form the adjusted read voltage level, as shown in FIG. 11H. In some examples, where the measure of CFBit increases with increased read voltage level, $\Delta V$ is subtracted from the lowest previous read voltage level to form the adjusted read voltage level, opposite to as shown in FIG. 11H.

Referring back to FIG. 9, at operation 924, the controller may determine the local minimum with the smallest valley height (e.g., with the smallest difference between the local minimum CFBit differential value and adjacent CFBit differential values).

At operation 926, the controller may adjust the read voltage level based on the differentiated values of the failed bit measurements. Referring to FIG. 11I, a diagram illustrating a method of calibrating read level voltage in memory devices are shown, in accordance with embodiments of the present disclosure. In some examples, linear interpolation can be used to determine an adjusted read voltage level based on the previously-measured CFBit values, the corresponding previous read voltage levels, and/or the predetermined target CFBit value, as shown in FIG. 11I. For example, the bolded downwards pointing arrow of FIG. 11I may correspond to a final adjusted read voltage level determined based on linear interpolation.

Figure 10:
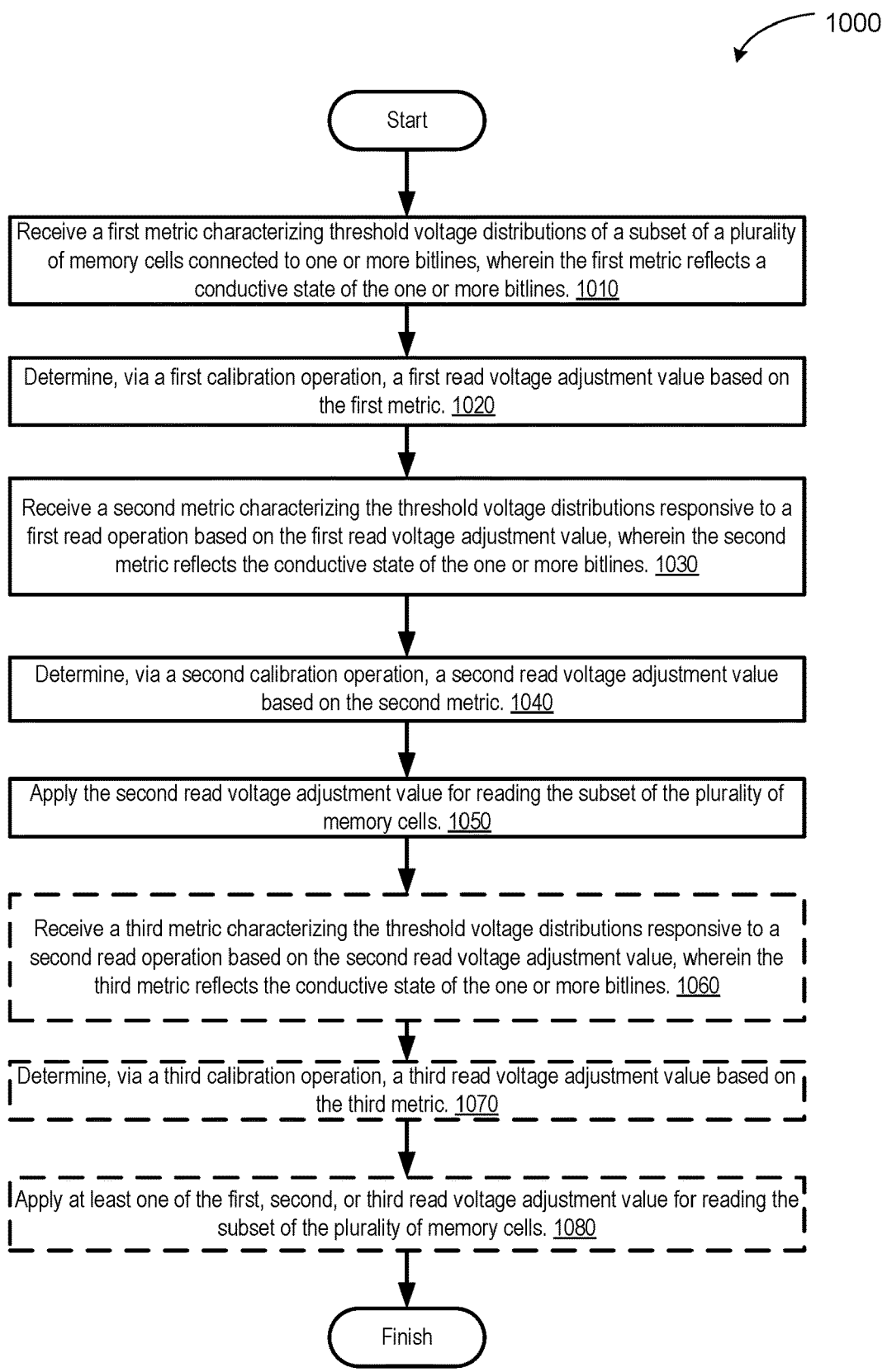
FIG. 10 is a flow diagram of an example method of calibrating read level voltage in memory devices, in accordance with embodiments of the present disclosure.

FIG. 10 is a flow diagram of an example method 1000 of calibrating read level voltage in memory devices, in accordance with embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 1000 is performed by the memory sub-system controller 115 and/or the local media controller 135 of FIG. 1.

In some implementations, the method 1000 can be performed within a read command, in order to calibrate prior to final sensing. In some implementations, the method 1000 can be performed by the media controller, and read threshold adjustment can be performed prior to final sensing of data. Thus, a single read command can involve receiving the required metadata, applying the read voltage adjustment values, and sensing the memory array to provide sensed data to be transferred via the memory interface.

Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 1010, the controller implementing the method 1000 may receive a first metric characterizing threshold voltage distributions of a subset of a plurality of memory cells. The memory cells may be connected to one or more bitlines of a memory device. The first metric reflects a conductive state of the one or more bitlines. In some embodiments, the first metric is a failed byte count (e.g., CFByte) as described herein.

At operation 1020, the controller may determine, via a first calibration operation, a first read voltage adjustment value based on the first metric. The first calibration operation may be a read voltage calibration operation based on the failed byte count (e.g., at operation 706 of FIG. 7).

At operation 1030, the controller may receive a second metric characterizing the threshold voltage distributions. The second metric may be received responsive to a first read operation based on the first read voltage adjustment value. For example, the first read operation may be performed responsive to the determining of the first read voltage adjustment value. In some examples, the read voltage level of the first read operation is based on the first read voltage adjustment value (e.g., a previous read voltage level is adjusted by the first read voltage adjustment value to form the read voltage level of the first read operation). The second metric reflects the conductive state of the one or more bitlines. In some embodiments, the second metric is a failed bit count (e.g., CFBit) as described herein.

At operation 1040, the controller may determine, via a second calibration operation, a second read voltage adjustment value based on the second metric. The second calibration operation may be a read voltage calibration based on failed bit count (e.g., at operation 708 of FIG. 7). In some embodiments, the second calibration operation may be iterative. For example, the second calibration operation may be performed multiple times to adjust the read voltage level.

At operation 1050, the controller may apply the second read voltage adjustment value for reading the subset of the plurality of memory cells.

At operation 1060, the controller may receive a third metric characterizing the threshold voltage distributions. The third metric may be received responsive to a second read operation based on the second read voltage adjustment value. The third metric may be a failed bit count. In some examples, the controller may receive CFBit responsive to the read operation performed in association with operation 1050. In some embodiments, the third metric reflects the conductive state of the one or more bitlines.

At operation 1070, the controller may determine, via a third calibration operation, a third read voltage adjustment value based on the third metric. The third calibration operation may be a read voltage convergence calibration (e.g., at operation 712 of FIG. 7). In some embodiments, the third calibration operation may be iterative. For example, the third calibration operation may be performed multiple times to adjust the read voltage level. Through multiple iterations of the third calibration operation, a final read voltage level may be converged upon.

At operation 1080, the controller may apply at least one of the first read voltage adjustment value, the second read voltage adjustment value, or the third read voltage adjustment value for reading the subset of the plurality of memory cells. For example, the controller may utilize the third read voltage adjustment value for determining a read voltage level for reading the subset of the plurality of memory cells. The third read voltage adjustment value may be based on the first read voltage adjustment value and/or based on the second read voltage adjustment value.

FIGS. 11A-I are diagrams illustrating methods of calibrating read level voltage in memory devices, in accordance with embodiments of the present disclosure. Certain embodiments are described herein above with reference to one or more of FIGS. 11A-I. FIGS. 11A-I show plots of failed bit count (e.g., CFBit) against read voltage level (e.g., read adjustment, read voltage level adjustment).

Figure 12:
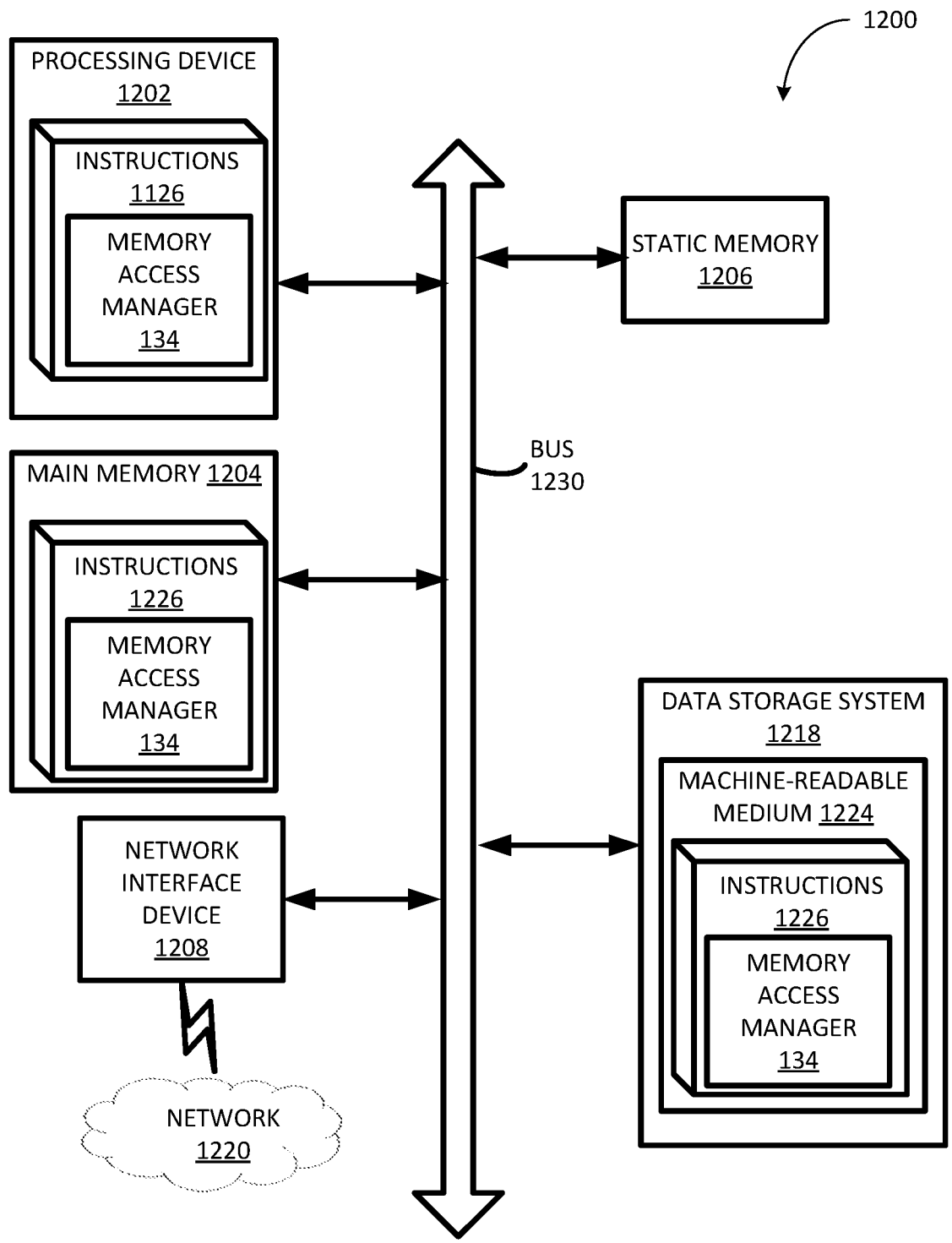
FIG. 12 is a block diagram of an example computer system in which embodiments of the present disclosure can operate.

FIG. 12 illustrates an example machine of a computer system 1200 within which a set of instructions, for causing the machine to perform any one or more of the methods discussed herein, can be executed. In some implementations, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to memory access manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methods discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium, such as a computer-readable non-transitory storage medium, a) on which is stored one or more sets of executable instructions 1226 or software embodying any one or more of the methods or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to memory access manager 134 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methods of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of memory cells; and
   a controller coupled to the memory array, the controller to perform operations comprising:
      receiving a first value of a first metric characterizing threshold voltage distributions of a subset of the plurality of memory cells connected to one or more bitlines, wherein the first value of the first metric reflects a first number of bytes of data stored in the plurality of memory cells, the first number of bytes of data associated with at least one non-conducting bitline of the one or more bitlines;
      determining, via a first calibration operation, a first read voltage adjustment value based on the first value of the first metric;
      receiving a second value of a second metric characterizing the threshold voltage distributions of the subset of the plurality of memory cells responsive to a first read operation performed with respect to the subset of the plurality of memory cells based on the first read voltage adjustment value, wherein the second value of the second metric reflects a second number of non-conducting bitlines associated with the plurality of memory cells;
      determining, via a second calibration operation, a second read voltage adjustment value based on the second value of the second metric; and
      applying the second read voltage adjustment value for reading the subset of the plurality of memory cells.

2. The memory device of claim 1, wherein the controller is to perform operations further comprising:
   responsive to a second read operation performed with respect to the subset of the plurality of memory cells based on the second read voltage adjustment value, receiving a third value of the second metric, wherein the third value of the second metric reflects a third number of non-conducting bitlines associated with the plurality of memory cells;
   determining, via a third calibration operation, a third read voltage adjustment value based on the third value of the second metric, wherein the third calibration operation comprises a convergence operation based on differentiation of the second value of the second metric and the third value of the second metric; and
   applying at least one of the first read voltage adjustment value, the second read voltage adjustment value, or the third read voltage adjustment value for reading the subset of the plurality of memory cells.

3. The memory device of claim 2, wherein determining at least one of the second read voltage adjustment value or the third read voltage adjustment value comprises:
   applying a predefined mathematical transformation to at least one of the second value of the second metric or the third value of the second metric.

4. The memory device of claim 1, wherein a conductive state of the one or more bitlines is indicated by a failed byte count reflected by the first value of the first metric.

5. The memory device of claim 1, wherein a conductive state of the one or more bitlines is indicated by a failed bit count reflected by the second value of the second metric.

6. The memory device of claim 1, wherein receiving the first value of the first metric is responsive to a read operation performed with respect to the subset of the plurality of memory cells.

7. The memory device of claim 1, wherein the subset of the plurality of memory cells is at least a portion of a memory page.

8. The memory device of claim 1, wherein determining the first read voltage adjustment value comprises:
   identifying, in a data structure, an entry mapping the first value of the first metric to a corresponding read voltage adjustment value.

9. A computer-readable non-transitory storage medium comprising executable instructions that, when executed by a controller managing a memory device, cause the controller to:
   receive a first value of a first metric characterizing threshold voltage distributions of a subset of a plurality of memory cells connected to one or more bitlines, wherein the first value of the first metric reflects a first number of bytes of data stored in the plurality of memory cells, the first number of bytes associated with at least one non-conducting bitline of the one or more bitlines;
determine, via a first calibration operation, a first read voltage adjustment value based on the first value of the first metric;
receive a second value of a second metric characterizing the threshold voltage distributions of the subset of the plurality of memory cells responsive to a first read operation performed with respect to the subset of the plurality of memory cells based on the first read voltage adjustment value, wherein the second value of the second metric reflects a second number of non-conducting bitlines associated with the plurality of memory cells;
determine, via a second calibration operation, a second read voltage adjustment value based on the second value of the second metric; and
apply the second read voltage adjustment value for reading the subset of the plurality of memory cells.

10. The computer-readable non-transitory storage medium of claim 9, wherein the controller is further to:
responsive to a second read operation performed with respect to the subset of the plurality of memory cells based on the second read voltage adjustment value, receive a third value of the second metric, wherein the third value of the second metric reflects a third number of non-conducting bitlines associated with the plurality of memory cells;
determine, via a third calibration operation, a third read voltage adjustment value based on the third value of the second metric, wherein the third calibration operation comprises a convergence operation based on differentiation of the second value of the second metric and the third value of the second metric; and
apply at least one of the first read voltage adjustment value, the second read voltage adjustment value, or the third read voltage adjustment value for reading the subset of the plurality of memory cells.

11. The computer-readable non-transitory storage medium of claim 10, wherein determining at least one of the second read voltage adjustment value or the third read voltage adjustment value comprises:
applying a predefined mathematical transformation to at least one of the second value of the second metric or the third value of the second metric.

12. The computer-readable non-transitory storage medium of claim 9, wherein a conductive state of the one or more bitlines is indicated by a failed byte count reflected by the first value of the first metric.

13. The computer-readable non-transitory storage medium of claim 9, wherein a conductive state of the one or more bitlines is indicated by a failed bit count reflected by the second value of the second metric.

14. The computer-readable non-transitory storage medium of claim 9, wherein determining the first read voltage adjustment value comprises:
identifying, in a data structure, an entry mapping the first value of the first metric to a corresponding read voltage adjustment value.

15. A method comprising:
receiving a first value of a first metric characterizing threshold voltage distributions of a subset of a plurality of memory cells connected to one or more bitlines, wherein the first value of the first metric reflects a first number of bytes of data stored in the plurality of memory cells, the first number of bytes associated with at least one non-conducting bitline of the one or more bitlines;
determining, via a first calibration operation, a first read voltage adjustment value based on the first value of the first metric;
receiving a second value of a second metric characterizing the threshold voltage distributions of the subset of the plurality of memory cells responsive to a first read operation performed with respect to the subset of the plurality of memory cells based on the first read voltage adjustment value, wherein the second value of the second metric reflects a second number of non-conducting bitlines associated with the plurality of memory cells;
determining, via a second calibration operation, a second read voltage adjustment value based on the second value of the second metric; and
applying the second read voltage adjustment value for reading the subset of the plurality of memory cells.

16. The method of claim 15 further comprising:
responsive to a second read operation performed with respect to the subset of the plurality of memory cells based on the second read voltage adjustment value, receiving a third value of the second metric, wherein the third value of the second metric reflects a third number of non-conducting bitlines associated with the plurality of memory cells;
determining, via a third calibration operation, a third read voltage adjustment value based on the third value of the second metric, wherein the third calibration operation comprises a convergence operation based on differentiation of the second value of the second metric and the third value of the second metric; and
applying at least one of the first read voltage adjustment value, the second read voltage adjustment value, or the third read voltage adjustment value for reading the subset of the plurality of memory cells.

17. The method of claim 16, wherein determining at least one of the second read voltage adjustment value or the third read voltage adjustment value comprises:
applying a predefined mathematical transformation to at least one of the second value of the second metric or the third value of the second metric.

18. The method of claim 15, wherein receiving the first value of the first metric is responsive to a read operation performed with respect to the subset of the plurality of memory cells.

19. The method of claim 15, wherein the subset of the plurality of memory cells is at least a portion of a memory page.

20. The method of claim 15, wherein determining the first read voltage adjustment value comprises:
identifying, in a data structure, an entry mapping the first value of the first metric to a corresponding read voltage adjustment value.

* * * * *